United States Patent
Kouma et al.

(10) Patent No.: US 8,142,670 B2
(45) Date of Patent: Mar. 27, 2012

(54) MICRO-OSCILLATING ELEMENT AND METHOD OF MAKING THE SAME

(75) Inventors: Norinao Kouma, Kawasaki (JP); Osamu Tsuboi, Kawasaki (JP); Hiromitsu Soneda, Kawasaki (JP); Satoshi Ueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 614 days.

(21) Appl. No.: 12/292,540

(22) Filed: Nov. 20, 2008

(65) Prior Publication Data

US 2009/0107949 A1    Apr. 30, 2009

Related U.S. Application Data

(62) Division of application No. 11/352,200, filed on Feb. 13, 2006, now Pat. No. 7,476,950.

(30) Foreign Application Priority Data

Feb. 16, 2005 (JP) ................................. 2005-039162

(51) Int. Cl.
  *B44C 1/22* (2006.01)
  *C25F 3/00* (2006.01)
(52) U.S. Cl. .................. 216/11; 216/2; 438/50
(58) Field of Classification Search .......... 216/11, 216/2; 438/50
See application file for complete search history.

(56) References Cited

U.S. PATENT DOCUMENTS

| | | | |
|---|---|---|---|
| 6,287,885 B1 | 9/2001 | Muto et al. | 438/48 |
| 6,795,225 B2 | 9/2004 | Tsuboi et al. | 359/224 |
| 6,887,396 B2 | 5/2005 | Tsuboi et al. | |
| 6,927,470 B2 | 8/2005 | Murari et al. | 257/432 |
| 6,969,629 B2 * | 11/2005 | Kouma et al. | 438/50 |
| 7,033,515 B2 | 4/2006 | Kouma et al. | 216/2 |
| 7,220,009 B2 | 5/2007 | Shimada et al. | |
| 7,224,097 B2 | 5/2007 | Obi et al. | |
| 7,391,222 B2 | 6/2008 | Nishio | |
| 7,411,714 B2 | 8/2008 | Tsuboi et al. | 359/226 |

(Continued)

FOREIGN PATENT DOCUMENTS

JP    05-076186    3/1993

(Continued)

OTHER PUBLICATIONS

Japanese Office Action dated Jan. 27, 2010.

(Continued)

*Primary Examiner* — Roberts Culbert
(74) *Attorney, Agent, or Firm* — Kratz, Quintos & Hanson, LLP

(57) ABSTRACT

A micro-oscillating element includes a frame, a movable functional portion, and a torsional joint for joining the frame and the functional portion. The micro-oscillating element also includes first and second comb-tooth electrodes for generation of the driving force for the oscillating motion of the movable functional portion about the torsional joint. The first comb-tooth electrode includes a plurality of first electrode teeth each having a first conductor, an insulator and a second conductor laminated in the direction of the oscillating motion, where the first conductor and the second conductor are electrically connected with each other. The second comb-tooth electrode includes a plurality of second electrode teeth caused not to face the second conductor but to face the first conductor of the first electrode teeth during non-operation. The second electrode teeth are longer than the first conductor in the direction of the oscillating motion.

3 Claims, 29 Drawing Sheets

U.S. PATENT DOCUMENTS

| | | |
|---|---|---|
| 7,420,315 B2 | 9/2008 | Yoda |
| 7,494,594 B2 | 2/2009 | Onoda et al. ............... 216/2 |
| 7,529,011 B2 | 5/2009 | Fujii |
| 2004/0155556 A1 | 8/2004 | Onoda et al. ............ 310/309 |

FOREIGN PATENT DOCUMENTS

| | | |
|---|---|---|
| JP | 05-224751 | 9/1993 |
| JP | 10-190007 | 7/1998 |
| JP | 10-270714 | 10/1998 |
| JP | 2000-031502 | 1/2000 |
| JP | 2000-055670 | 2/2000 |
| JP | 2002-328316 | 11/2002 |
| JP | 2003-015064 | 1/2003 |
| JP | 2003-172890 | 6/2003 |
| JP | 2004-145032 | 5/2004 |
| JP | 2004-266991 | 9/2004 |
| JP | 2005-173411 | 6/2005 |
| JP | 2005-205577 | 8/2005 |
| JP | 2005-205578 | 8/2005 |
| JP | 2005-308863 | 11/2005 |
| JP | 2006-005731 | 1/2006 |
| JP | 2006-167859 | 6/2006 |
| JP | 2006-167860 | 6/2006 |
| JP | 2006-184603 | 7/2006 |

OTHER PUBLICATIONS

Japanese Office Action dated Mar. 17, 2009, relating to counterpart Japanese Document No. 2005-039162.

* cited by examiner

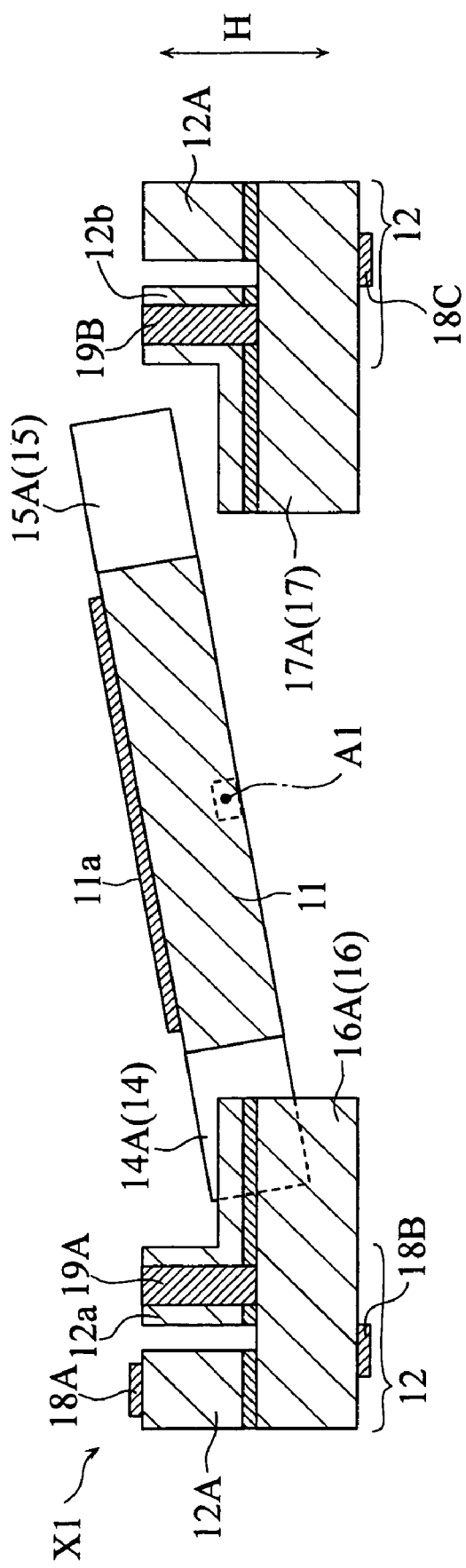

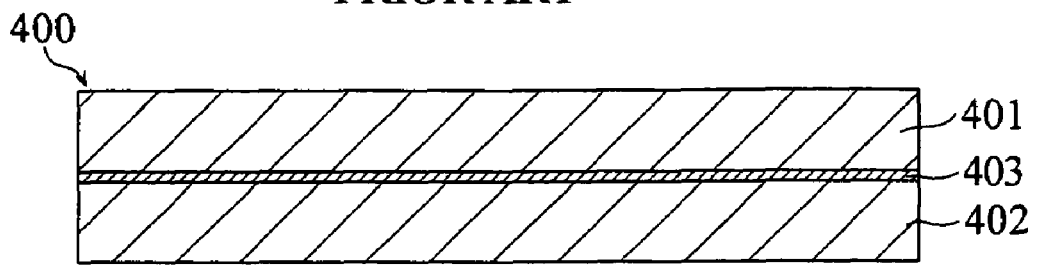
FIG.32A
PRIOR ART
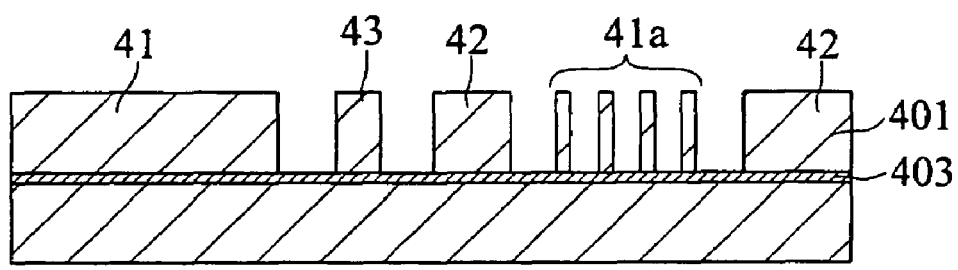
FIG.32B
PRIOR ART
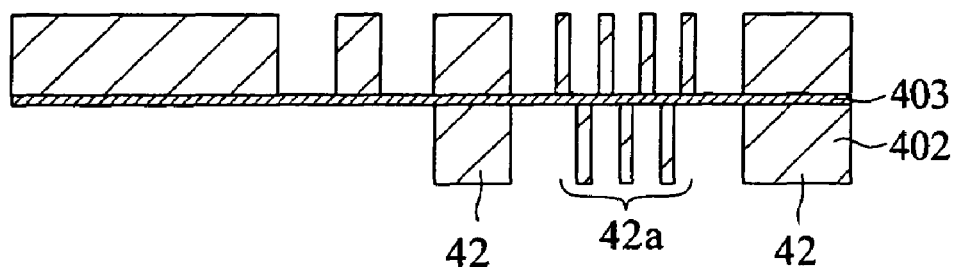
FIG.32C
PRIOR ART
FIG.32D
PRIOR ART
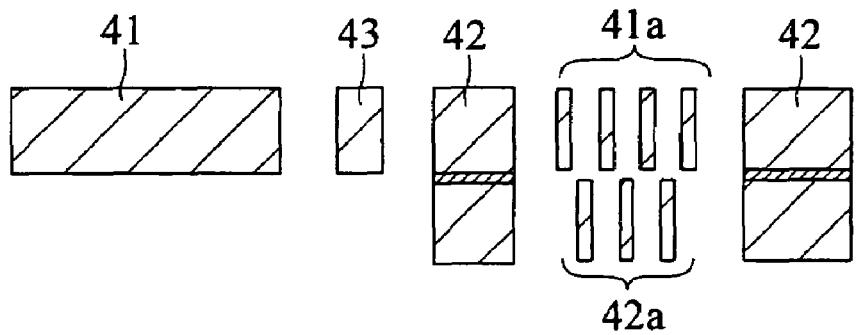

MICRO-OSCILLATING ELEMENT AND METHOD OF MAKING THE SAME

This application is a divisional application of prior application Ser. No. 11/352,200, filed on Feb. 13, 2006 now U.S. Pat. No. 7,476,950.

BACKGROUND OF THE INVENTION

1. Field of the Invention

The present invention relates to micro-oscillating elements which include a rotationally displaceable part, such as micromirror elements, acceleration sensors, angular speed sensors, vibration elements and so on.

2. Description of the Related Art

In recent years, efforts have been made for making practical use of elements which have a micro-structure formed by micromachining technology. In the field of optical communications technology for example, micromirror elements which are tiny elements capable of reflecting light are gathering attention.

In the optical communications, optical fibers serve as a medium through which optical signals are passed. When the optical signal passing through a given optical fiber is switched to another optical fiber, so-called optical switching devices are used in general. In order to achieve high quality optical communications, the optical switching device must have such characteristics as high capacity, high speed and high reliability, in switching action. In view of these, micromirror elements manufactured by utilizing micromachining technology are gathering attention as a switching element to be incorporated in the optical switching devices. The micromirror elements enable the switching operation without converting optical signals into electric signals between the optical paths on the input side and the output side of the optical switching device. This is advantageous in achieving the above-mentioned characteristics.

Micromirror elements have mirror surfaces for reflecting light, and are capable of varying the direction of light reflection by pivoting the mirror surfaces. Many micromirror elements which are used in optical devices are electrostatically-driven. The electrostatically-driven micromirror elements are roughly divided into two types: the micromirror element manufactured by so called surface micromachining technology, and the micromirror element manufactured by so called bulk micromachining technology.

In the surface micromachining technology, material thin film is formed on a substrate, into a desired pattern according to component parts to be made. Such a pattern is laminated in sequence to form supports, mirror surfaces, electrodes and other component parts which constitute the element as well as sacrifice layers which will be removed later. On the other hand, in the bulk micromachining technology, etching is made to a material substrate itself, whereby supports, mirror regions and so on are made into desired shapes. Thin-film formation is performed as necessary, to form mirror surfaces and electrodes. Technical details of the bulk micromachining technology are disclosed in the following Patent Documents for example: JP-A-10-190007, JP-A-10-270714, and JP-A-2000-31502.

Micromirror elements must satisfy a technical requirement that the mirror surface which is responsible for reflecting light should be highly flat. However, according to the surface micromachining technology, the finalized mirror surface is thin and susceptible to warp, and it is difficult to achieve a high level of flatness over a large area of mirror surface. On the contrary, according to the bulk micromachining technology, a relatively thick material substrate is etched to form mirror regions, and mirror surfaces are made on this mirror regions. Therefore, it is possible to provide rigidity to a large area of mirror surface, and as a result, it is possible to form mirror surfaces which have sufficiently high optical flatness.

FIG. 30 is a partially unillustrated exploded perspective view of a conventional micromirror element X4 manufactured by the bulk micromachining technology. The micromirror element X4 includes: a mirror support 41 which has an upper surface provided with a mirror surface; a frame 42 (partially unillustrated); and a pair of torsion bars 43 connecting these. The mirror support 41 has a pair of ends formed with a pair of comb-tooth electrodes 41a, 41b. The frame 42 is formed with a pair of inwardly extended comb-tooth electrodes 42a, 42b correspondingly to the comb-tooth electrodes 41a, 41b. The torsion bars 43 provide an axis for oscillating action of the mirror support 41 with respect to the frame 42.

According to the micromirror element X4 which has the structure as described, a set of comb-tooth electrodes which are placed closely to each other for generation of electrostatic force, e.g. the comb-tooth electrode 41a and the comb-tooth electrode 42a, are apart from each other, making an upper and a lower tiers as shown in FIG. 31A when no voltage is applied. When a voltage is applied on the other hand, as shown in FIG. 31B, the comb-tooth electrode 41a is drawn in between the comb-tooth electrode 42a, pivotally displacing the mirror support 41. More specifically, when the comb-tooth electrodes 41a, 42a are supplied with a predetermined voltage and whereby the comb-tooth electrode 41a is positively charged and the comb-tooth electrode 42a is negatively charged, then there is electrostatic attraction developed between the comb-tooth electrodes 41a, 42a, which rocks the mirror support 41 around the axis A4 while twisting the torsion bars 43. By utilizing such oscillating motion of the mirror support 41, it is possible to switch light reflecting directions in which light is reflected by the mirror surface 44.

FIGS. 32A-32D show a manufacturing method for the micromirror element X4. In these figures, views of a section will be given to illustrate a process of forming those components which are shown in FIG. 30, i.e. part of the mirror support 41, the frame 42, the torsion bars 43 and part of a pair of comb-tooth electrodes 41a, 42a. The section represents a section of a material substrate (a wafer) to which the manufacturing processes is performed, and more specifically a section of a single block from which a single micromirror element is formed. The section includes sections of a plurality of component regions, and the sectional views are illustrative sequential depictions.

In the method of manufacturing the micromirror element X4, a material substrate 400 as shown in FIG. 32A is prepared first. The material substrate 400 is a so called SOI (Silicon on Insulator), which has a laminate structure including a silicon layer 401 and a silicon layer 402, and an insulation layer 403 between them. Next, as shown in FIG. 32B, the silicon layer 401 is subjected to anisotropic etching via a predetermined mask to form structural components (mirror support 41, part of the frame 42, the torsion bars 43 and the comb-tooth electrode 41a) on the silicon layer 401. Next, as shown in FIG. 32C, the silicon layer 402 is subjected to anisotropic etching via a predetermined mask to form structural components (part of the frame 42 and the comb-tooth electrode 42a) on the silicon layer 402. Next, as shown in FIG. 32D, the insulation layer 403 is subjected to isotropic etching to remove exposed portions of the insulation layer 403. In this way, formation is made for the mirror support 41, the frame 42, the torsion bars 43 and the comb-tooth electrodes 41a, 42a. The other set of comb-tooth electrodes 41b, 42b are formed in the same way as the comb-tooth electrodes 41a, 42a.

According to the micromirror element X4 as described above, when rotational displacement of the mirror support 41 is 0°, the comb-tooth electrodes 41a, 42a are spaced from each other in the direction of thickness of the element as shown in FIG. 31A and FIG. 32D. Therefore, when the comb-tooth electrodes 41a, 42a are supplied with a predetermined voltage, electrostatic attraction generated between the comb-tooth electrodes 41a, 42a is not appropriately effective. In addition, the comb-tooth electrodes 41b, 42b are spaced from each other in the direction of thickness of the element, and therefore when the comb-tooth electrodes 41b, 42b are supplied with a predetermined voltage, electrostatic attraction generated between the comb-tooth electrodes 41b, 42b is not appropriately effective. For these reasons, when moving the mirror support 41 from the rotational displacement of 0° by generating electrostatic attraction between the comb-tooth electrodes 41a, 42a or between the comb-tooth electrodes 41b, 42b, it is sometimes impossible to achieve sufficient response necessary for the movement. Likewise, when stopping the mirror support 41 at the rotational displacement of 0°, it is difficult to control the electrostatic attraction highly accurately around the stopping point, which leads to so called residual vibration, i.e. a phenomenon that the mirror support 41 keeps oscillating near the rotational displacement of 0°, making impossible for the mirror support 41 to make an immediate stop. As understood, the micromirror element X4 has a problem of poor controllability of the mirror support 41 (movable functional portion) in the oscillating motion particularly during the starting and the stopping periods of the movement. The micromirror element X4 as described poses difficulty in precise high-speed driving operation of the mirror support 41.

SUMMARY OF THE INVENTION

The present invention was made under the circumstances as described above, and it is therefore an object of the present invention to provide micro-oscillating elements advantageous in controllability of the oscillating motion of the movable functional portion, and to provide methods for manufacturing such micro-oscillating elements.

A first aspect of the present invention provides a micro-oscillating element. The micro-oscillating element includes a frame, a movable functional portion, a torsional joint which joints the frame and the movable functional portion with each other and provides the movable functional portion with an axis for oscillating motion, and a first comb-tooth electrode and a second comb-tooth electrode for generation of a driving force for the oscillating motion. The first comb-tooth electrode includes a plurality of first electrode teeth, each of which has a laminate structure of a first conductor and a second conductor electrically connected with each other and an insulator between the first and the second conductor. The conductors and the insulator are laminated in a direction of the oscillating motion. The second comb-tooth electrode includes a plurality of second electrode teeth which does not face the second conductors but faces the first conductors of the first electrode teeth during non-operation. The second electrode teeth are longer than the first conductors in the direction of the oscillating motion. In the present invention, the term "non-operation" of the micro-oscillating element refers to a state where there is no electrostatic attraction (driving force) between the first and the second comb-tooth electrodes and the movable functional portion assumes a rotational displacement of 0°.

According to the micro-oscillating element, even when the movable functional portion has a rotational displacement of 0°, the first conductors of the first electrode teeth in the first comb-tooth electrode face the second electrode teeth in the second comb-tooth electrode. In other words, even when the movable functional portion has a rotational displacement of 0°, the first and the second comb-tooth electrodes overlap with each other in the element's thickness direction. When a predetermined voltage is applied to the first comb-tooth electrode, the first conductors and the second conductors which are electrically connected with each other within the same one of the first electrode teeth assume the same voltage. Therefore, in the present micro-oscillating element, even when the rotational displacement of the movable functional portion is 0°, application of a predetermined voltage to the first and the second comb-tooth electrodes generates effective electrostatic attraction between the comb-tooth electrodes. Thus, according to the present micro-oscillating element, when moving the movable functional portion from the rotational displacement of 0° by generating electrostatic attraction between the first and the second comb-tooth electrodes, it is easy to achieve sufficient response in the movement. On the other hand, when stopping the movable functional portion at the rotational displacement of 0°, it is possible to control electrostatic attraction highly accurately near the stopping position. Therefore, it is easy to stop the movable functional portion quickly, by reducing residual vibration of the movable functional portion near the rotational displacement of 0°.

During the operation of the micro-oscillating element, when the rotational displacement of the movable functional portion is not close to 0°, the first electrode teeth in the first comb-tooth electrode face the second electrode teeth of the second comb-tooth electrode, generating effective electrostatic attraction between the first and the second comb-tooth electrodes.

In addition, in the micro-oscillating element, the second electrode teeth of the second comb-tooth electrode are longer in the direction of oscillating motion, than the first conductors of the first electrode teeth in the first comb-tooth electrode. Such an arrangement is suitable for generation of effective electrostatic attraction in that the area of opposed surfaces between the first and the second comb-tooth electrodes changes as the movable functional portion pivots.

As described above, the present micro-oscillating element has superb controllability over the entire range of oscillating motion of the movable functional portion including the starting and stopping operations. The micro-oscillating element as described is suitable for quick and accurate operation of the movable functional portion.

According to a preferred mode of embodiment, the frame includes a multi-layered portion which is composed of a first conduction layer, a second conduction layer and an insulation layer between the first and the second conduction layers. The first comb-tooth electrode is fixed to the multi-layered portion of the frame. The first conductors of the first electrode teeth are continuous to and electrically connected with the first conduction layer. The second conductors of the first electrode teeth are continuous to and electrically connected with the second conduction layer, and the first and the second conduction layers are electrically connected with each other by a conduction path which penetrates the insulation layer. Such an arrangement enables appropriate electrical connection of the first and the second conductors in the first comb-tooth electrode.

According to another preferred embodiment, the movable functional portion includes a multi-layered portion which has a first conduction layer, a second conduction layer and an insulation layer between the first and the second conduction layers. The first comb-tooth electrode is fixed to the multi-layered portion of the movable functional portion. The first conductors of the first electrode teeth are continuous to and electrically connected with the first conduction layer. The second conductors of the first electrode teeth are continuous to and electrically connected with the second conduction layer, and the first and the second conduction layers are electrically connected with each other by a conduction path which penetrates the insulation layer. Such an arrangement enables appropriate electrical connection of the first and the second conductors in the first comb-tooth electrode.

A second aspect of the present invention provides another micro-oscillating element. This micro-oscillating element includes a frame, a movable functional portion, a torsional joint which joints the frame and the movable functional portion with each other and provides the movable functional portion with an axis for oscillating motion, and a first comb-tooth electrode and a second comb-tooth electrode for generation of a driving force for the oscillating motion. The first comb-tooth electrode includes a plurality of first electrode teeth, each of which has a laminate structure of a first conductor and a second conductor electrically connected with each other and a first insulator between the first and the second conductor. The first and the second conductors and the first insulator are laminated in a direction of the oscillating motion. The second comb-tooth electrode includes a plurality of second electrode teeth, each of which has a laminate structure of a third conductor and a fourth conductor electrically connected with each other and a second insulator between the third and the fourth conductor. The third and the fourth conductors and the second insulator are laminated in a direction of the oscillating motion. During non-operation of the present element, the second conductors of the first electrode teeth do not face the second electrode teeth, and the first conductors of the first electrode teeth do not face the fourth conductors of the second electrode teeth but face the third conductors.

According to the present micro-oscillating element, even when the movable functional portion has a rotational displacement of 0°, the first conductors of the first electrode teeth in the first comb-tooth electrode face the third conductors of the second electrode teeth in the second comb-tooth electrode. In other words, even when the movable functional portion has a rotational displacement of 0°, the first and the second comb-tooth electrodes overlap with each other in the element's thickness direction. When a predetermined voltage is applied to the first comb-tooth electrode, the first conductors and the second conductors which are electrically connected with each other within the same one of the first electrode teeth assume the same voltage. Further, when a predetermined voltage is applied to the second comb-tooth electrode, the third conductors and the fourth conductors which are electrically connected with each other within the same one of the second electrode teeth assume the same voltage. Therefore, in the present micro-oscillating element, even when the rotational displacement of the movable functional portion is 0°, application of a predetermined voltage to the first and the second comb-tooth electrodes generates effective electrostatic attraction between the comb-tooth electrodes. Thus, according to the present micro-oscillating element, when moving the movable functional portion from the rotational displacement of 0° by generating electrostatic attraction between the first and the second comb-tooth electrodes, it is easy to achieve sufficient response in the movement. On the other hand, when stopping the movable functional portion at the rotational displacement of 0°, it is possible to control electrostatic attraction highly accurately near the stopping position. Therefore, it is easy to stop the movable functional portion quickly, by reducing residual vibration of the movable functional portion near the rotational displacement of 0°.

During the operation of the micro-oscillating element, when the rotational displacement of the movable functional portion is not close to 0°, the first electrode teeth in the first comb-tooth electrode face the second electrode teeth of the second comb-tooth electrode, generating effective electrostatic attraction between the first and the second comb-tooth electrodes.

In addition, in the present micro-oscillating element, the first comb-tooth electrode or the first electrode teeth are offset from the second comb-tooth electrode or the second electrode teeth in the direction of oscillating motion. Such an arrangement is suitable for generation of effective electrostatic attraction in that the area of opposed surfaces between the first and the second comb-tooth electrodes changes as the movable functional portion pivots.

As described above, the present micro-oscillating element has superb controllability over the entire range of oscillating motion of the movable functional portion including the starting and stopping operations. The micro-oscillating element as described is suitable for quick and accurate operation of the movable functional portion.

In the second aspect of the present invention, preferably, the frame includes a first multi-layered portion which is composed of a first conduction layer, a second conduction layer and a first insulation layer between the first and the second conduction layers. The movable functional portion includes a second multi-layered portion which is composed of a third conduction layer, a fourth conduction layer and a second insulation layer between the third and the fourth conduction layers. The first comb-tooth electrode is fixed to the first multi-layered portion of the frame. The second comb-tooth electrode is fixed to the second multi-layered portion of the movable functional portion. The first conductors of the first electrode teeth are continuous to and electrically connected with the first conduction layer. The second conductors of the first electrode teeth are continuous to and electrically connected with the second conduction layer, and the first and the second conduction layers are electrically connected with each other by a conduction path which penetrates the first insulation layer. The third conductors of the second electrode teeth are continuous to and electrically connected with the third conduction layer. The fourth conductors of the second electrode teeth are continuous to and electrically connected with the fourth conduction layer, and the third and the fourth conduction layers are connected with each other by a conduction path which penetrates the second insulation layer. Such an arrangement enables appropriate electrical connection of the first and the second conductors in the first comb-tooth electrode, as well as appropriate electrical connection of the third and the fourth conductors in the second comb-tooth electrode.

A third aspect of the present invention provides a method of manufacturing a micro-oscillating element from a material substrate which has a laminate structure including a first conduction layer, a second conduction layer and an insulation layer between the first and the second conduction layers. The micro-oscillating element includes a frame, a movable functional portion, a torsional joint which joints the frame and the movable functional portion with each other and provides an axis for oscillating motion of the movable functional portion, and a first comb-tooth electrode and a second comb-tooth electrode for generation of a driving force for the oscillating motion. The method includes: a first etching step of etching the first conduction layer partway in its thickness direction via a first mask pattern which includes a masking portion for the first comb-tooth electrode and formed on the first conduction layer and a second mask pattern which includes a masking portion for the second comb-tooth electrode and formed on the first conduction layer; a step of removing the first mask pattern; a second etching step of etching the first conduction layer via the second mask pattern for leaving in the first conduction layer the first conductor of the first comb-tooth electrode and the second comb-tooth electrode, in contact with the insulation layer; a third etching step of etching the second conduction layer via a third mask pattern which includes a second masking portion for the first comb-tooth electrode and formed on the second conduction layer for leaving in the second conduction layer the second conductor of the first comb-tooth electrode in contact with the insulation layer; and a fourth etching step of etching the insulation layer for leaving in the insulation layer the insulator between the first and the second conductors of the first comb-tooth electrode. Such a method as the above enables appropriate manufacture of the micro-oscillating element according to the first aspect of the present invention. Each of the etching steps may be performed by a single etching process, or by a plurality of etching processes.

According to a preferred mode of embodiment in the third aspect of the present invention, the first mask pattern includes a masking portion for the torsional joint. The second etching step also leaves in the first conduction layer the torsional joint in contact with the insulation layer. Such an arrangement as the above enables appropriate manufacture of a torsional joint which has a dimension smaller than the second electrode teeth in the thickness-wise direction of the material substrate (thickness-wise direction of the element).

According to another preferred mode of embodiment in the third aspect of the present invention, the second conduction layer incorporates a fourth mask pattern which includes a masking portion for the torsional joint and is embedded off the insulation layer. The third etching process also leaves in the second conduction layer the torsional joint in contact with the insulation layer. The distance by which the fourth mask pattern is off the insulation later is equal to the dimension of the torsional joint in the thickness-wise direction of the material substrate (thickness-wise direction of the element). Such an arrangement as the above enables appropriate manufacture of a torsional joint whose dimension is smaller than the first electrode teeth in the thickness-wise direction of the material substrate (thickness-wise direction of the element).

BRIEF DESCRIPTION OF THE DRAWINGS

FIG. 9 is a sectional view during operation taken in lines III-III in FIG. 1.

FIGS. 31A-32B show an orientation of a pair of comb-tooth electrodes.
FIGS. 32A-32D show several steps of a method for manufacture of the conventional micromirror element.

DETAILED DESCRIPTION OF THE PREFERRED EMBODIMENT

Figure 1:
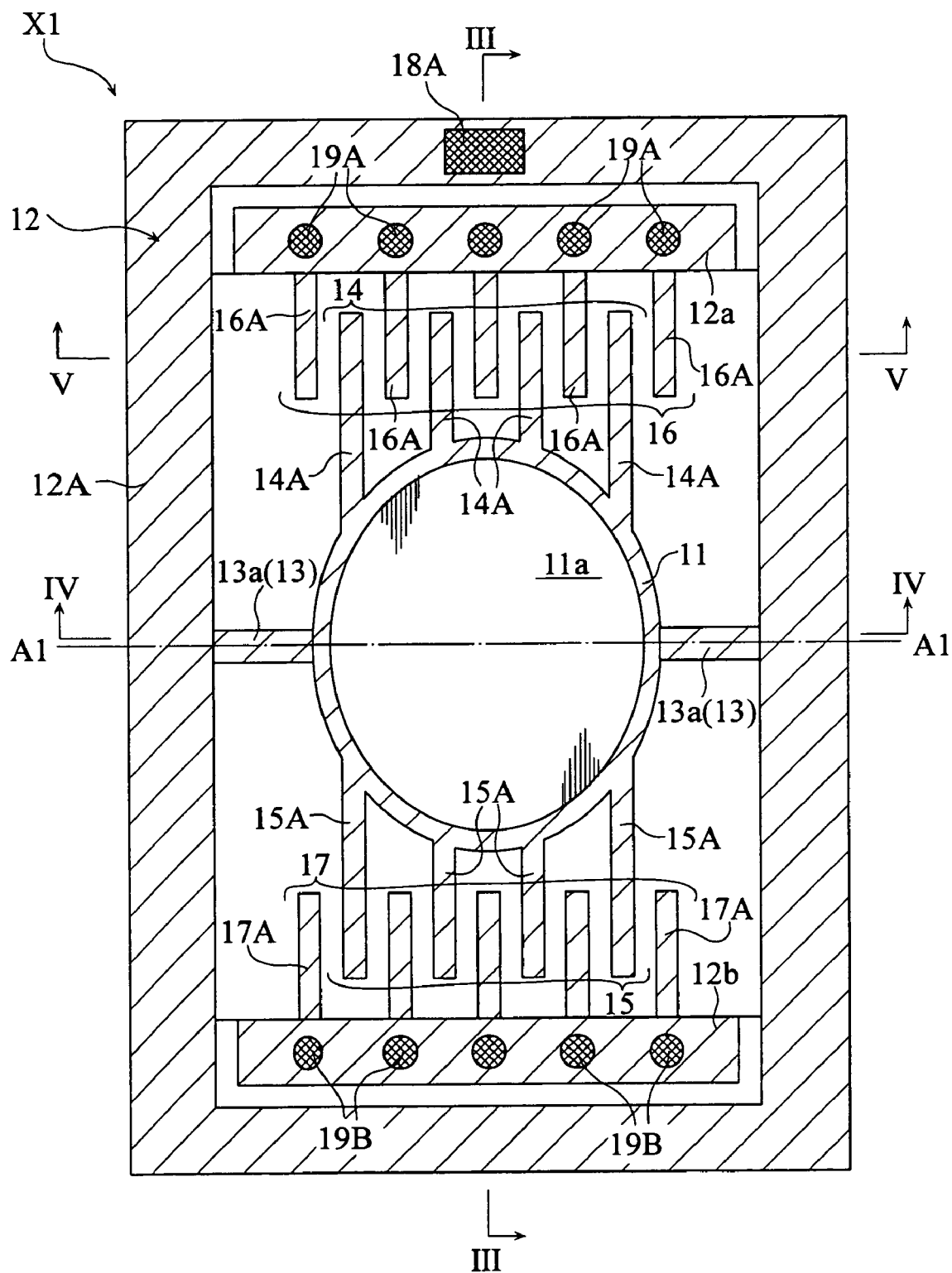
FIG. 1 is a front view of a micromirror element according to a first embodiment of the present invention.
Figure 2:
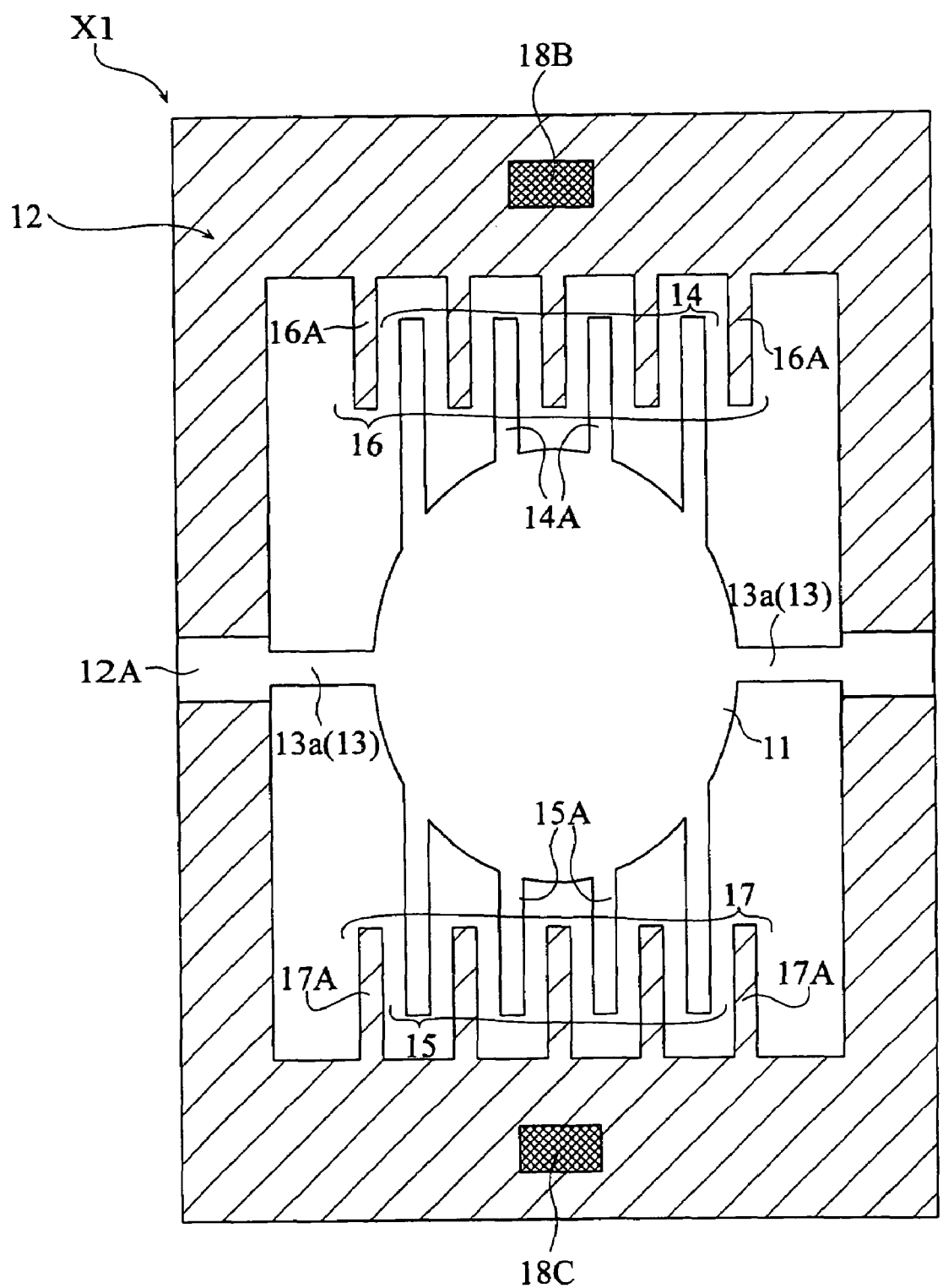
FIG. 2 is a rear view of the micromirror element according to the first embodiment of the present invention.
Figure 3:
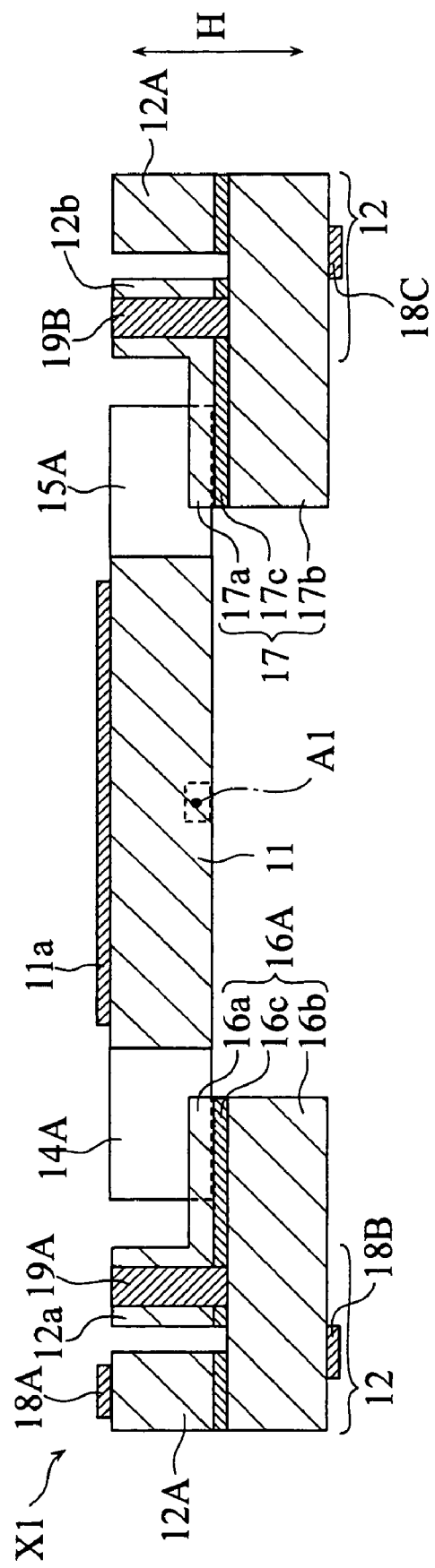
FIG. 3 is a sectional view taken in lines III-III in FIG. 1.
Figure 4:
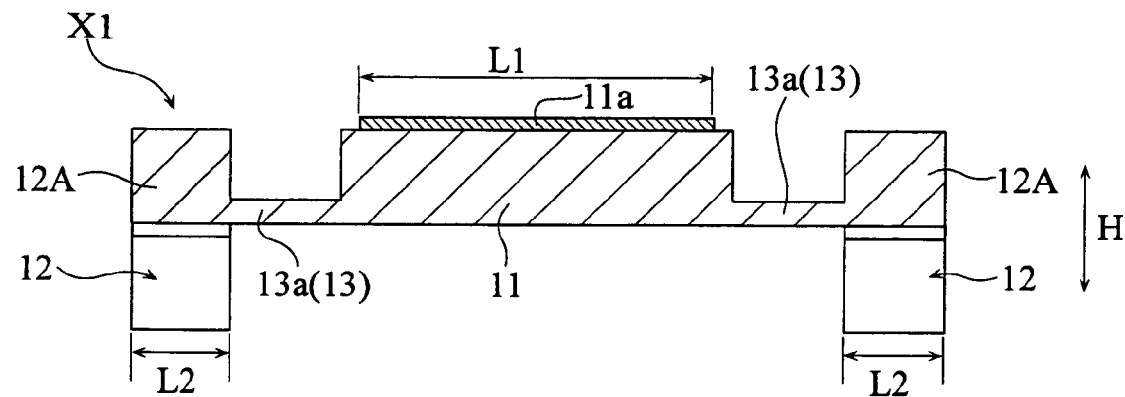
FIG. 4 is a sectional view taken in lines IV-IV in FIG. 1.
Figure 5:
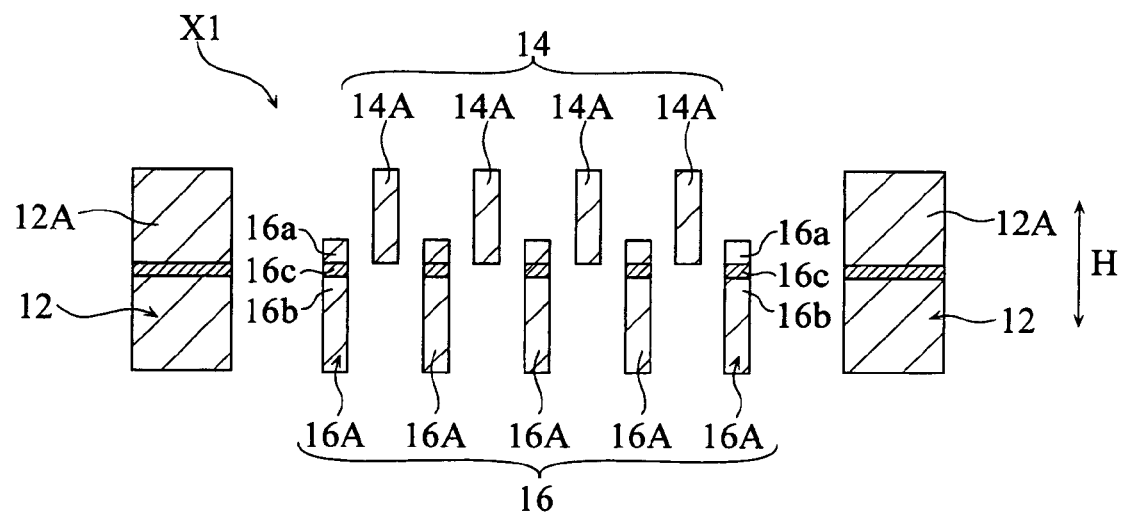
FIG. 5 is a sectional view taken in lines V-V in FIG. 1.

FIG. 1 through FIG. 5 show a micromirror element X1 according to a first embodiment of the present invention. FIG. 1 and FIG. 2 are a front view and a rear view of the micromirror element X1 respectively. FIG. 3 through FIG. 5 are sectional views taken in lines III-III, IV-IV and V-V in FIG. 1 respectively.

The micromirror element X1 includes a mirror support 11, a frame 12, torsional joint 13 and comb-tooth electrodes 14, 15, 16, 17, and is manufactured by bulk micromachining technology which is a type of MEMS technology, from a material substrate provided by an SOI wafer. The material substrate has a laminate structure composed of a first and a second silicon layers and an insulation layer between the silicon layers. Each silicon layer is doped with impurity, and thereby given a predetermined level of electrical conductivity. Each of the above-mentioned portions in the micromirror element X1 is derived primarily from the first silicon layer and/or the second silicon layer. For the sake of viewing clarity, hatching is made in FIG. 1, to indicate regions which are derived from the first silicon layer and protruding above the paper surface toward the viewer. Likewise, hatching is made in FIG. 2, to indicate regions which are derived from the second silicon layer and protruding above the paper surface toward the viewer.

The mirror support 11 is derived from the first silicon layer, and its surface is provided with a mirror surface 11a which is capable of reflecting light. The mirror surface 11a has a laminate structure composed e.g. of a Cr layer formed on the first silicon layer and an Au layer formed thereon. The mirror support 11 and the mirror surface 11a as described above constitute a movable functional portion according to the present invention. Note that a length L1 of the mirror support 11 or the movable functional portion indicated in FIG. 4 is 20 through 300 µm for example.

The frame 12 is derived primarily from the first and the second silicon layers, and as shown in FIG. 1 and FIG. 2, surrounds the mirror support 11. The portion of frame 12 derived from the first silicon layer includes, as shown in FIG. 1 and FIG. 3, a main portion 12A and islands 12a, 12b which are spaced from the main portion. As shown in FIG. 1, an electrode pad 18A is provided on the main portion 12A. As shown in as shown in FIG. 2, electrode pads 18B, 18C are provided on the portion of frame 12 derived from the second silicon layer. In the portion derived from the second silicon layer in the frame 12, the region provided with the electrode pad 18B and the region provided with the electrode pad 18C are separated from each other both structurally and electrically. As shown in FIG. 3, in the frame 12, the island 12a, part of the portion derived from the insulation layer (the hatched region in FIG. 3 right below the main portion 12A and the islands 12a, 12b) and the portion derived from the second silicon layer constitute a first multi-layered portion. The island 12b, part of the portion derived from the insulation layer and part of the portion derived from the second silicon layer constitute a second multi-layered portion. In these multi-layered portions, the island 12a is electrically connected with the portion of frame 12 derived from the second silicon layer, via a conduction plug 19A which penetrates the portion of frame 12 derived from the insulation layer. The island 12b is electrically connected with the portion of frame 12 derived from the second silicon layer, via a conduction plug 19B which penetrates the portion of frame 12 derived from the insulation layer. The frame 12 described above has a length L2 indicated in FIG. 4, which is 5 through 50 µm for example.

The torsional joint 13 includes a pair of torsion bars 13a. Each of the torsion bars 13a is derived from the first silicon layer, and connects with the main portion 12A of the frame 12 as well as with the mirror support 11, thereby jointing them. The torsion bars 13a provide electrical connection between the main portion 12A of the frame 12 and the mirror support 11. As shown in FIG. 4, in the present embodiment, the torsion bars 13a are thinner than the mirror support 11 and the main portion 12A of the frame 12 in a thickness direction H of the element. Alternatively, the torsion bars 13a may have the same thickness as the mirror support 11 and the main portion 12A of the frame 12 in the thickness direction H of the element. The torsional joint 13 or the torsion bars 13a as described above provide an axis A1 for oscillating motion of the mirror support 11 or the movable functional portion. The axis A1 as such preferably passes through or near the center of gravity of the mirror support 11 or of the movable functional portion.

The comb-tooth electrode 14 includes a plurality of electrode teeth 14A which are derived from the first silicon layer. As shown in FIG. 1 and FIG. 2, all of the electrode teeth 14A extend from the mirror support 11 and are parallel to each other. The comb-tooth electrode 15 includes a plurality of electrode teeth 15A which are derived from the first silicon layer. The electrode teeth 15A extend from the mirror support 11 on a side away from the electrode teeth 14A, and are parallel to each other. Preferably, the direction in which the electrode teeth 14A, 15A extends is perpendicular to the direction in which the oscillating axis A1 extends. The comb-tooth electrode 14 or the electrode teeth 14A and the comb-tooth electrode 15 or the electrode teeth 15A are electrically connected with each other as described above, via the mirror support 11.

The comb-tooth electrode 16, which works with the comb-tooth electrode 14 to generate electrostatic attraction (driving force), includes a plurality of electrode teeth 16A. The electrode teeth 16A extend from the frame 12, and are parallel to each other. As shown in FIG. 3 and FIG. 5, each of the electrode teeth 16A has a laminate structure composed of a conductor 16a derived from the first silicon layer, a conductor 16b derived from the second silicon layer and an insulator 16c derived from the insulation layer and being between the conductors 16a, 16b. These conductors 16a, 16b and the insulator 16c stack one after another in the direction of oscillating motion of the movable functional portion. The conductor 16a is continuous to and electrically connected with the island 12a of the frame 12. The conductor 16b is continuous to and electrically connected with the portion of frame 12 derived from the second silicon layer. Therefore, the conductor 16a and the conductor 16b are electrically connected with each other via the island 12a, the conduction plug 19A, and the portion of frame 12 derived from the second silicon layer. The insulator 16c is continuous to the portion of frame 12 derived from the insulation layer.

The comb-tooth electrode 16 as described above constitutes a drive mechanism together with the comb-tooth electrode 14. As shown in FIG. 1 and FIG. 2, the electrode teeth 14A of the comb-tooth electrode 14 extend parallel to the electrode teeth 16A of the comb-tooth electrode 16. As shown in FIG. 1, FIG. 2 and FIG. 5, the comb-tooth electrodes 14, 16 have their respective electrode teeth 14A, 16A offset from each other so that they will not hit each other when the mirror support 11 or the movable functional portion makes oscillating motion. During non-operation when the micromirror element X1 is not driven, as shown in FIG. 3 and FIG. 5, the electrode teeth 14A do not face the conductors 16b of the electrode teeth 16A, but face the conductors 16a. In other words, the comb-tooth electrode 14 or the electrode teeth 14A overlap with the comb-tooth electrode 16 or the electrode teeth 16A in a thickness-wise direction H of the element. The electrode teeth 14A are longer than the conductors 16a of the electrode teeth 16A in the element's thickness-wise direction H.

The comb-tooth electrode 17, which works with the comb-tooth electrode 15 to generate electrostatic attraction (driving force), includes a plurality of electrode teeth 17A. The electrode teeth 17A extend from the frame 12, and are parallel to each other as shown in FIG. 1 and FIG. 2. As shown in FIG. 3, each of the electrode teeth 17A has a laminate structure composed of a conductor 17a derived from the first silicon layer, a conductor 17b derived from the second silicon layer and an insulator 17c derived from the insulation layer and is between the conductors 17a, 17b. These conductors 17a, 17b and the insulator 17c stack one after another in the direction of oscillating motion of the movable functional portion. The conductor 17a is continuous to and electrically connected with the island 12b of the frame 12. The conductor 17b is continuous to and electrically connected with the portion of frame 12 derived from the second silicon layer. Therefore, the conductor 17a and the conductor 17b are electrically connected with each other via the island 12b, the conduction plug 19B, and the portion of frame 12 derived from the second silicon layer. The insulator 17c is continuous to the portion of frame 12 derived from the insulation layer.

The comb-tooth electrode 17 as described above constitutes a drive mechanism together with the comb-tooth electrode 15. As shown in FIG. 1 and FIG. 2, the electrode teeth 15A of the comb-tooth electrode 15 extend parallel to the electrode teeth 17A of the comb-tooth electrode 17. The comb-tooth electrodes 15, 17 have their respective electrode teeth 15A, 17A offset from each other so that they will not hit each other when the mirror support 11 or the movable functional portion makes oscillating motion. During non-operation when the micromirror element X1 is not driven, as shown in FIG. 3, the electrode teeth 15A do not face the conductors 17b of the electrode teeth 17A, but face the conductors 17a. In other words, the comb-tooth electrode 15 or the electrode teeth 15A overlap with the comb-tooth electrode 17 or the electrode teeth 17A in the thickness-wise direction H of the element. The electrode teeth 15A are longer than the conductors 17a of the electrode teeth 17A in the element's thickness-wise direction H.

Figure 7A:
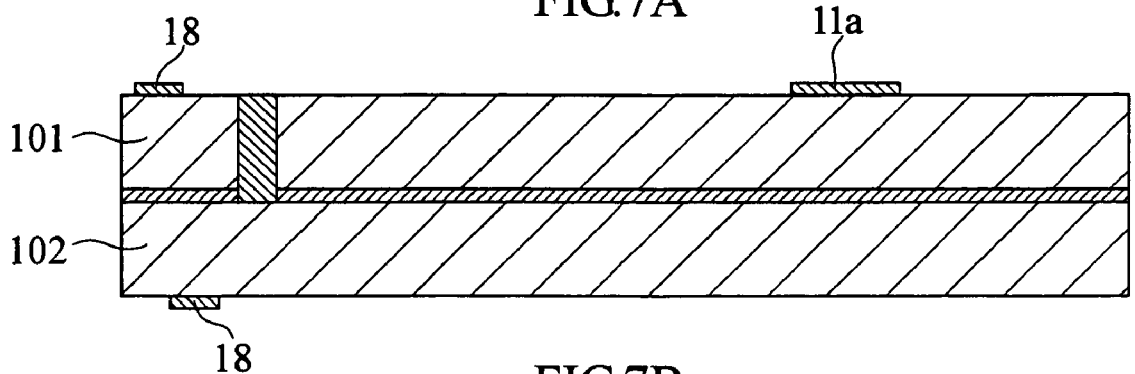
FIGS. 7A-7D show steps following those in FIG. 6.
Figure 7B:
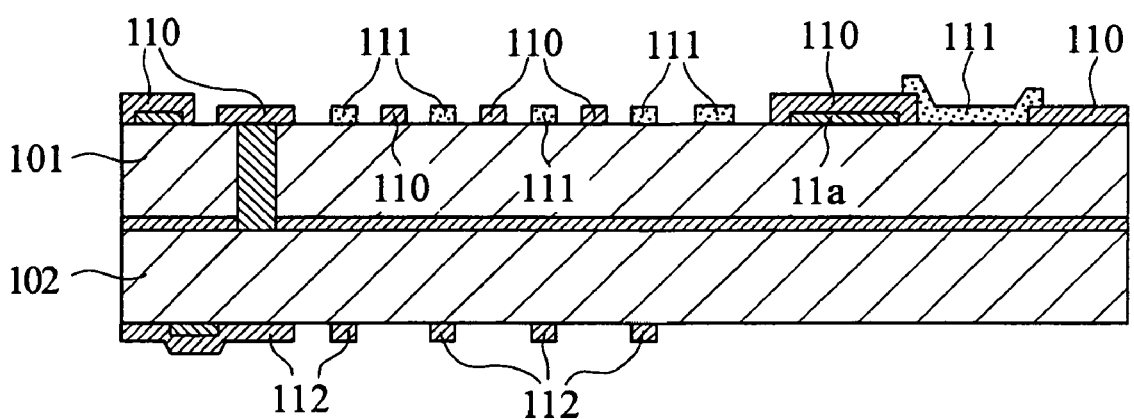
Figure 7C:
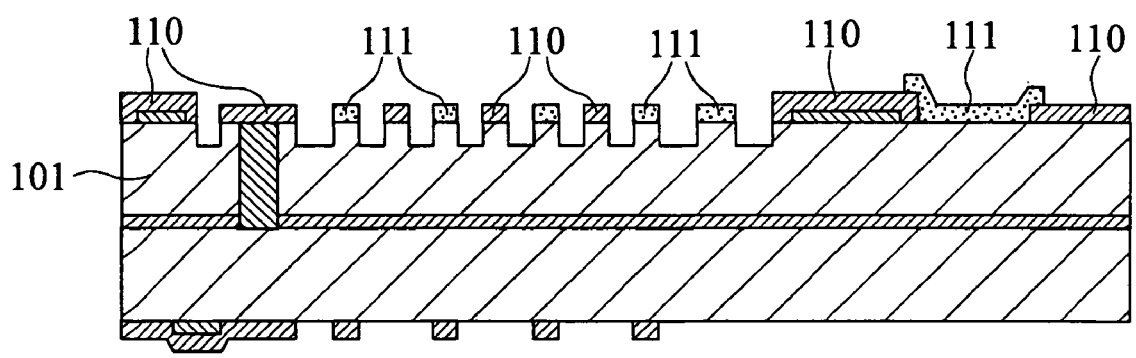
Figure 7D:
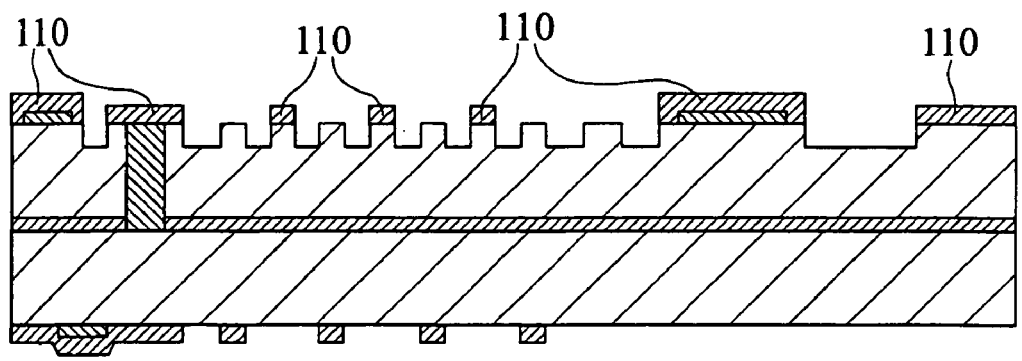
Figure 8A:
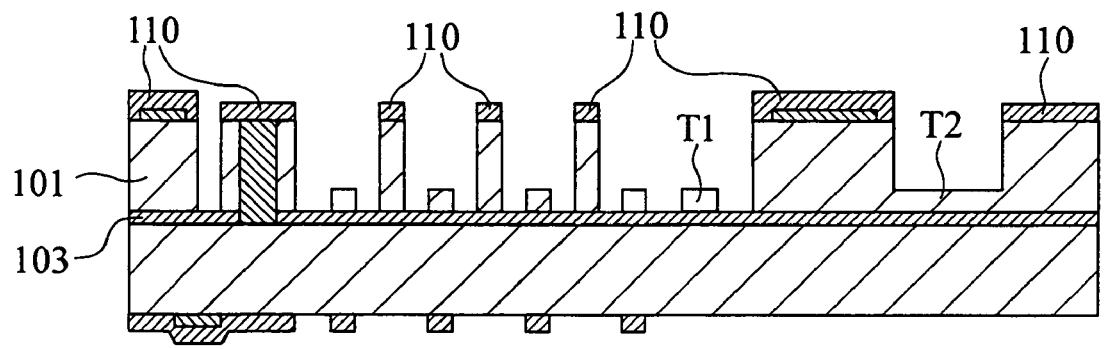
FIGS. 8A-8C show steps following those in FIG. 7.
Figure 8B:
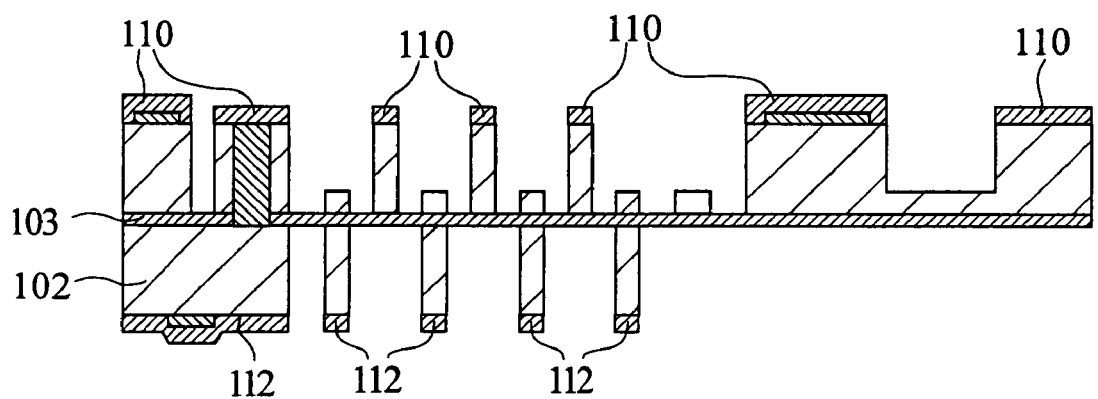
Figure 8C:
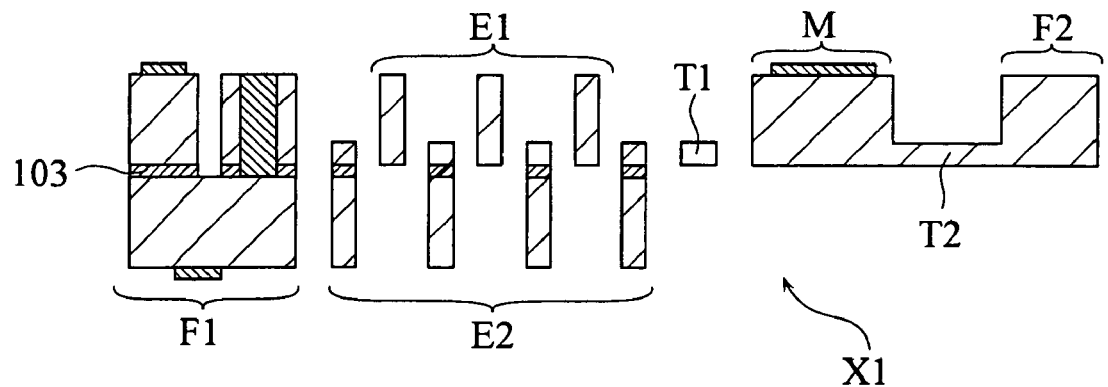

FIG. 6 through FIG. 8 shows a method of manufacturing the micromirror element X1. The method is an example through which the micromirror element X1 is manufactured by bulk micromachining technology. Throughout FIG. 6 to FIG. 8, views of a section will be given to illustrate a process of forming those components which are shown in FIG. 8C, i.e. a mirror support M, frames F1, F2, torsion bars T1, T2, and a pair of comb-tooth electrodes E1, E2. The section represents a section of a material substrate (a wafer having a multi-layer structure) to which micromachining is performed, and more specifically a section of a single block from which a single micromirror element is formed. The section includes sections of a plurality of component regions, and the sectional views are illustrative sequential depictions. The mirror support M represents part of the mirror support 11. The frames F1, F2 represent the frame 12, shown in selected sections thereof. The torsion bar T1 represents the torsion bars 13a, and is expressed in a cross section of the torsion bar 13a. The torsion bar T2 represents the torsion bars 13a, and is expressed in a longitudinal section of the torsion bar 13a. The comb-tooth electrode E1 represents part of the comb-tooth electrodes 14, 15, and is expressed in a cross section of the electrode teeth 14A, 15A. The comb-tooth electrode E2 represents part of the comb-tooth electrodes 16, 17, and is expressed in a cross section of the electrode teeth 16A, 17A.

Figure 6A:
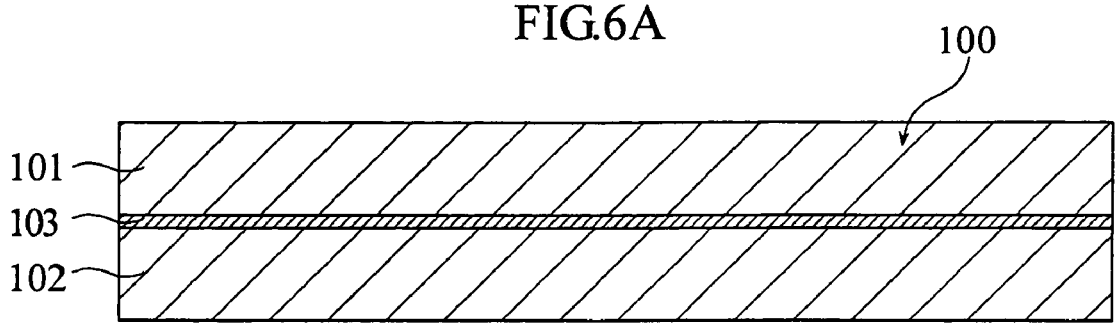
FIGS. 6A-6D show several steps of a method for manufacture of the micromirror element according to the first embodiment.

In the manufacture of the micromirror element X1, first, a material substrate 100 as shown in FIG. 6A is prepared. The material substrate 100 is an SOI wafer which has a laminate structure composed of silicon layers 101, 102, and an insulation layer 103 between the silicon layers 101, 102. The silicon layers 101, 102 are made of a silicon material which is doped with impurity and thereby rendered conductive. The impurity can be selected from p-type impurities such as B or from n-type impurities such as P and Sb. The insulation layer 103 is provided by silicon oxide for example. The silicon layer 101 has a thickness of e.g. 20 through 100 μm. The silicon layer 102 has a thickness of e.g. 100 through 600 μm. The insulation layer 103 has a thickness of e.g. 0.5 through 5 μm.

Figure 6B:
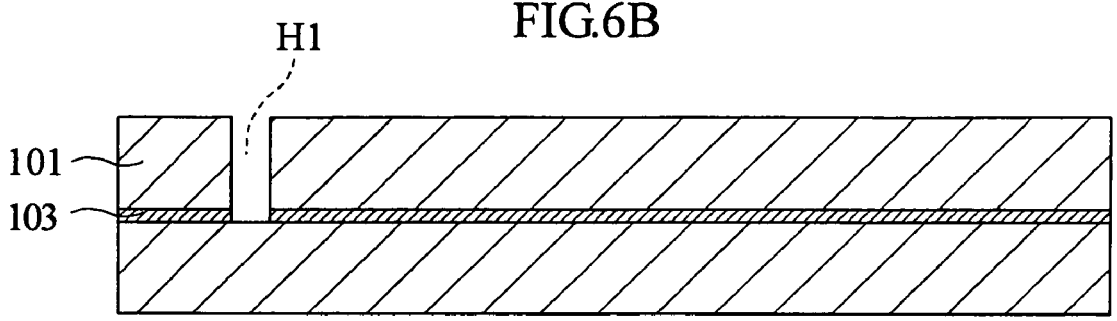

Next, as shown in FIG. 6B, a hole H1 is formed to penetrate the silicon layers 101 and the insulation layer 103. In forming the hole H1, first, the silicon layer 101 is subjected to anisotropic etching by DRIE (Deep Reactive Ion Etching) via a predetermined mask, until the insulation layer 103 is reached, to form a predetermined hole in the silicon layer 101. In DRIE, good anisotropic etching is achievable in a Bosch process in which etching and side-wall protection are alternated with each other. The Bosch process may also be used in other DRIE processes to be described later. Next, areas in the insulation layer 103 exposed to the hole are removed by e.g. wet etching. In this way, the hole H1 is formed which penetrate the silicon layer 101 and the insulating layer 103.

Figure 6C:
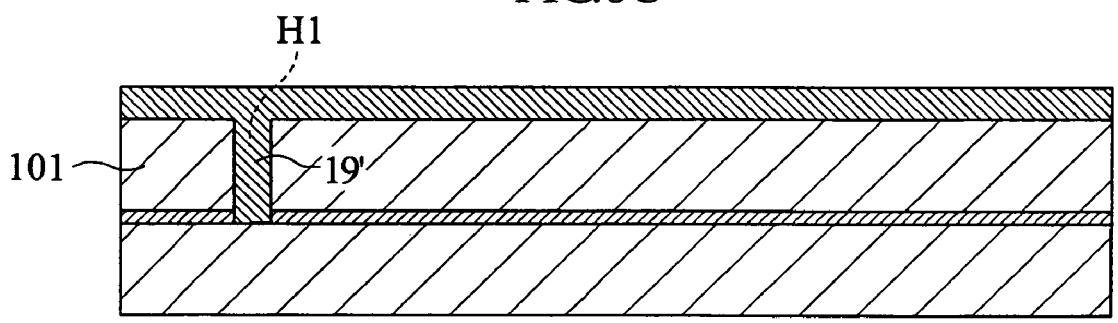

In the manufacture of the micromirror element X1, next, as shown in FIG. 6C, CVD method is used, for example, to make a deposit of electrically conductive material 19' inside the hole H1. During this step, a generous amount of the conductive material 19' is supplied to the hole H1 until the material builds up on the silicon layer 101. Examples of the electrically conductive material 19' include polysilicon doped with a predetermined impurity, and metals such as Cu and W. In order to make good electrical connection between the conductive material 19' and the silicon layer 101, it is preferable that naturally occurred film of oxide on the surface of hole H1 is removed with hydrofluoric acid for example, right before the conductive material 19' is deposited.

Figure 6D:
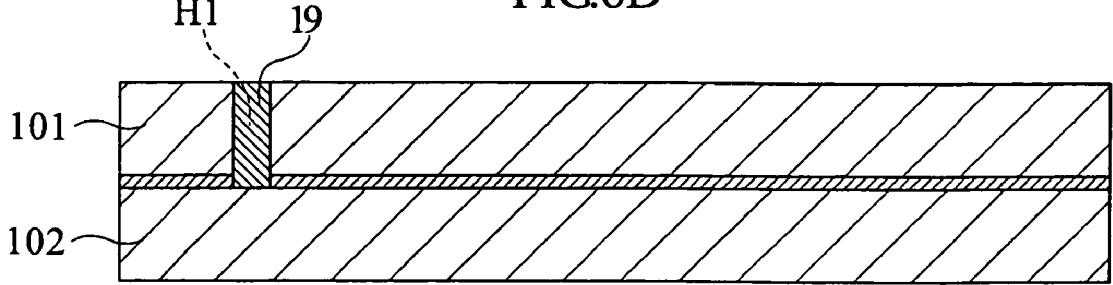

Next, as shown in FIG. 6D, the surface of the silicon layer 101 is exposed. The conductive material 19' outside of the hole H1 is removed by polishing for example. This step leaves a conduction plug 19. The conduction plug 19 represents the conduction plugs 19A, 19B. Once the material substrate undergoes this step, the silicon layer 101 and the silicon layer 102 are electrically connected with each other via the conduction plug 19.

In the manufacture of the micromirror element X1, next, as shown in FIG. 7A, a mirror surface 11a and electrode pads 18 are formed on the silicon layers 101, 102. In forming the mirror surface 11a and the electrode pad on the silicon layer 101, first, spattering method is used to form a film of e.g. Cr (50 nm) and then of Au (200 nm) on the silicon layer 101. Next, pattern formation is made by etching these metal films sequentially with predetermined masks, to form the mirror surface 11a and the electrode pad 18. Au can be etched by using an etchant such as potassium iodide/iodine aqueous solution. Cr can be etched by using an etchant such as di-ammonium cerium nitrate aqueous solution. When forming the electrode pad 18 on the silicon layer 102, the same method is used as used in the formation of the mirror surface 11a and the electrode pad 18 on the silicon layer 101. The electrode pad 18 on the silicon layer 101 represents the electrode pad 18A whereas the electrode pad 18 on the silicon layer 102 represents the electrode pads 18B, 18C.

In the manufacture of the micromirror element X1, next, as shown in FIG. 7B, an oxide film pattern 110 is formed on the silicon layer 101. Thereafter, a resist pattern 111 is formed thereon. Also, an oxide film pattern 112 is formed on the silicon layer 102. The oxide film pattern 110 has a pattern corresponding to the mirror support M (mirror support 11), the frames F1, F2 (frame 12), and the comb-tooth electrode E1 (comb-tooth electrodes 14, 15). The resist pattern 111 has a pattern corresponding to the torsion bars T1, T2 (torsion bars 13a) and the comb-tooth electrode E2 (comb-tooth electrodes 16, 17). The oxide film pattern 112 has a pattern corresponding to the frames F1, F2 (frame 12) and the comb-tooth electrode E2 (comb-tooth electrodes 16, 17). In forming the oxide film pattern 110, first, CVD method is used to form a film of silicon dioxide on the silicon layer 101 to a thickness of e.g. 1 μm. Next, the oxide film on the silicon layer 101 is patterned by etching via a predetermined resist pattern. The oxide film pattern 112 and other oxide film patterns to be described later are also formed by using the same method, which includes formation of an oxide film, formation of a resist pattern on the oxide film and etching thereafter. On the other hand, in the formation of the resist pattern 111, first, a liquid photoresist is spin-coated on the silicon layer 101. Next, the photo-resist film is patterned through an exposure process and a development process thereafter. Examples of the photo-resist include AZP 4210 (made by Clariant Japan) and AZ 1500 (made by Clariant Japan). Other resist patterns which are already described and those which will be described later can also be formed through the same steps of photo-resist film formation, exposure process and development process.

Next, as shown in FIG. 7C, anisotropic etching by DRIE is performed to the silicon layer 101 using the oxide film pattern 110 and the resist pattern 111 as masks, to a predetermined depth. The predetermined depth is a depth corresponding to the thickness of the torsion bars T1, T2, which may be 5 μm for example.

Next, as shown in FIG. 7D, the resist pattern 111 is removed with a remover. The remover may be AZ Remover 700 (made by Clariant Japan).

Next, as shown in FIG. 8A, anisotropic etching by DRIE is performed to the silicon layer 101 using the oxide film pattern 110 as a mask, to leave the torsion bars T1, T2, and until the insulation layer 103 is reached. This etching process yields the mirror support M (mirror support 11), the comb-tooth electrode E1 (comb-tooth electrodes 14, 15), the torsion bars T1, T2 (torsion bars 13a), and part of the frames F1, F2 (frame 12).

Next, as shown in FIG. 8B, anisotropic etching by DRIE is performed to the silicon layer 102 using the oxide film pattern 112 as a mask, until the insulation layer 103 is reached. This etching process yields part of the frames F1, F2 (frame 12), and the comb-tooth electrode E2 (comb-tooth electrodes 16, 17).

Next, as shown in FIG. 8C, exposed portions in the insulation layer 103, and oxide film patterns 110, 112 are removed by etching. The removal can be achieved by dry etching or wet etching. If dry etching is used, examples of usable etching gas include $CF_4$ and $CHF_3$. If wet etching is used, the etchant used in this process may be buffered hydrofluoric acid (BHF) which contains hydrofluoric acid and ammonium fluoride.

The above-described series of steps yield the mirror support M, the frames F1, F2, the torsion bars T1, T2 and the comb-tooth electrodes E1, E2, whereby the micromirror element X1 is manufactured.

In the micromirror element X1, by applying a predetermined voltage to the comb-tooth electrodes 14, 15, 16, 17 as required, it is possible to move the mirror support 11 or the movable functional portion around the oscillating axis A1. Voltage application to the comb-tooth electrodes 14, 15 can be achieved via the electrode pad 18A, the main portion 12A of the frame 12, the torsional joint 13 (both of the torsion bars 13a), and the mirror support 11. The comb-tooth electrodes 14, 15 are grounded for example. On the other hand, voltage application to the comb-tooth electrode 16 can be achieved via the electrode pad 18B and the portion of frame 12 derived from the second silicon layer, as well as via the conduction plug 19A and the island 12a. Voltage application to the comb-tooth electrode 17 can be achieved via the electrode pad 18C and the portion of frame 12 derived from the second silicon layer, as well as the conduction plug 19B and the island 12b. As previously described, in the portion of frame 12 derived from the second silicon layer, the place where the electrode pad 18B is connected is electrically separated from the place where the electrode pad 18C is connected. Therefore, voltage application to the comb-tooth electrodes 16, 17 can be made independently from each other.

When a desired static electrical attraction is generated between the comb-tooth electrodes 14, 16 by applying a predetermined voltage to each of the comb-tooth electrodes 14, 16, the comb-tooth electrode 14 is drawn in the comb-tooth electrode 16. This causes the mirror support 11 or the movable functional portion to pivot around the oscillating axis A1, achieving a rotational displacement as shown in FIG. 9 for example, until the electrostatic attraction balances with the sum of torsional resistance forces in the torsion bars 13a. In the oscillating motion as described, the amount of rotational displacement can be adjusted by adjusting the voltage applied to the comb-tooth electrodes 14, 16. When the electrostatic attraction between the comb-tooth electrodes 14, 16 is ceased, each of the torsion bars 13a comes back to its natural state, bringing the mirror support 11 or the movable functional portion to an attitude shown in FIG. 3.

On the other hand, when a desired static electrical attraction is generated between the comb-tooth electrode 15, 17 by applying a predetermined voltage to each of the comb-tooth electrodes 15, 17, the comb-tooth electrode 15 is drawn in the comb-tooth electrode 17. This causes the mirror support 11 or the movable functional portion to pivot about the oscillating axis A1, achieving a rotational displacement until the electrostatic attraction balances with the sum of torsional resistance forces in the torsion bars 13a. In the oscillating motion as described, the amount of rotational displacement can be adjusted by adjusting the voltage applied to the comb-tooth electrodes 15, 17. When the electrostatic attraction between the comb-tooth electrodes 15, 17 is ceased, each of the torsion bars 13a comes back to its natural state, bringing the mirror support 11 or the movable functional portion to the attitude shown in FIG. 3.

Through the oscillating drive of the mirror support 11 or the movable functional portion as described above, it is possible to appropriately switch light reflecting directions in which light is reflected by the mirror surface 11a provided on the mirror support 11.

In the micromirror element X1, even when the movable functional portion (mirror support 11, mirror surface 11a) has a rotational displacement of 0° as shown in FIG. 3, the conductor 16a of each electrode tooth 16A in the comb-tooth electrode 16 faces its corresponding electrode tooth 14A in the comb-tooth electrode 14, whereas the conductor 17a of each electrode tooth 17A in the comb-tooth electrode 17 faces its corresponding electrode tooth 15A in the comb-tooth electrode 15. In other words, even when the movable functional portion has a rotational displacement of 0°, the comb-tooth electrodes 14, 16 overlap with each other in the element thickness direction H, and the comb-tooth electrodes 15, 17 overlap with each other in the element thickness direction H. When a predetermined voltage is applied to the comb-tooth electrode 16, the conductor 16a and the conductor 16b which are electrically connected with each other within the same one of the electrode teeth 16A assume the same voltage. Likewise, when a predetermined voltage is applied to the comb-tooth electrode 17, the conductor 17a and the conductor 17b which are electrically connected with each other within the same one of the electrode teeth 17A assume the same voltage. Therefore, in the micromirror element X1, even when the rotational displacement of the movable functional portion is 0°, application of a predetermined voltage to the comb-tooth electrodes 14, 16 generates effective electrostatic attraction between the comb-tooth electrodes 14, 16, and application of a predetermined voltage to the comb-tooth electrodes 15, 17 generates effective electrostatic attraction between the comb-tooth electrodes 15, 17. Therefore, when moving the movable functional portion from the rotational displacement of 0° by generating electrostatic attraction between the comb-tooth electrodes 14, 16 or between the comb-tooth electrode 15, 17 in the micromirror element X1, it is easy to achieve sufficient response in the movement. On the other hand, when stopping the movable functional portion at the rotational displacement of 0°, it is possible to control electrostatic attraction between the comb-tooth electrodes 14, 16 or between the comb-tooth electrode 15, 17 highly accurately near the stopping position. Therefore, it is easy to stop the movable functional portion quickly, by reducing residual vibration of the movable functional portion near the rotational displacement of 0°.

During the operation of the micromirror element X1, when the rotational displacement of the movable functional portion is not close to 0°, each of the electrode teeth 14A in the comb-tooth electrode 14 faces not only with the conductor 16a but also the conductor 16b of the comb-tooth electrode 16, generating effective electrostatic attraction between the comb-tooth electrodes 14, 16. Otherwise, each of the electrode teeth 15A in the comb-tooth electrode 15 faces not only with the conductor 17a but also the conductor 17b of the comb-tooth electrode 17, generating effective electrostatic attraction between the comb-tooth electrodes 15, 17.

In addition, in the micromirror element X1, the electrode teeth 14A of the comb-tooth electrode 14 are longer in the direction of oscillating motion, than the conductors 16a of the electrode teeth 16A in the comb-tooth electrode 16. Further, the electrode teeth 15A of the comb-tooth electrode 15 are longer in the direction of oscillating motion, than the conductors 17a of the electrode teeth 17A in the comb-tooth electrode 17. Such an arrangement is suitable for generation of effective electrostatic attraction in that the area of opposed surfaces between the comb-tooth electrodes 14, 16 or between the comb-tooth electrode 15, 17 changes as the movable functional portion pivots.

As described above, the micromirror element X1 has superb controllability over the entire range of oscillating motion of the movable functional portion including the starting and stopping operations. The micromirror element X1 is suitable for quick and accurate operation of the movable functional portion.

Further, according to the method of manufacturing the micromirror element X1 described above, highly accurate control is possible over the overlapping dimension in the element thickness direction H between the comb-tooth electrode 14 or the electrode teeth 14A and the comb-tooth electrode 16 or the electrode teeth 16A, as well as the overlapping dimension in the element thickness direction H between the comb-tooth electrode 15 or the electrode teeth 15A and the comb-tooth electrode 17 or the electrode teeth 17A. This is because the comb-tooth electrode E1 (comb-tooth electrodes 14, 15) is formed to a high level of accuracy in the element thickness direction H, in the etching process described with reference to FIG. 8A, where the comb-tooth electrode E1 (comb-tooth electrodes 14, 15) is formed by utilizing the insulation layer 103 which serves as an etch stop layer.

Figure 10:
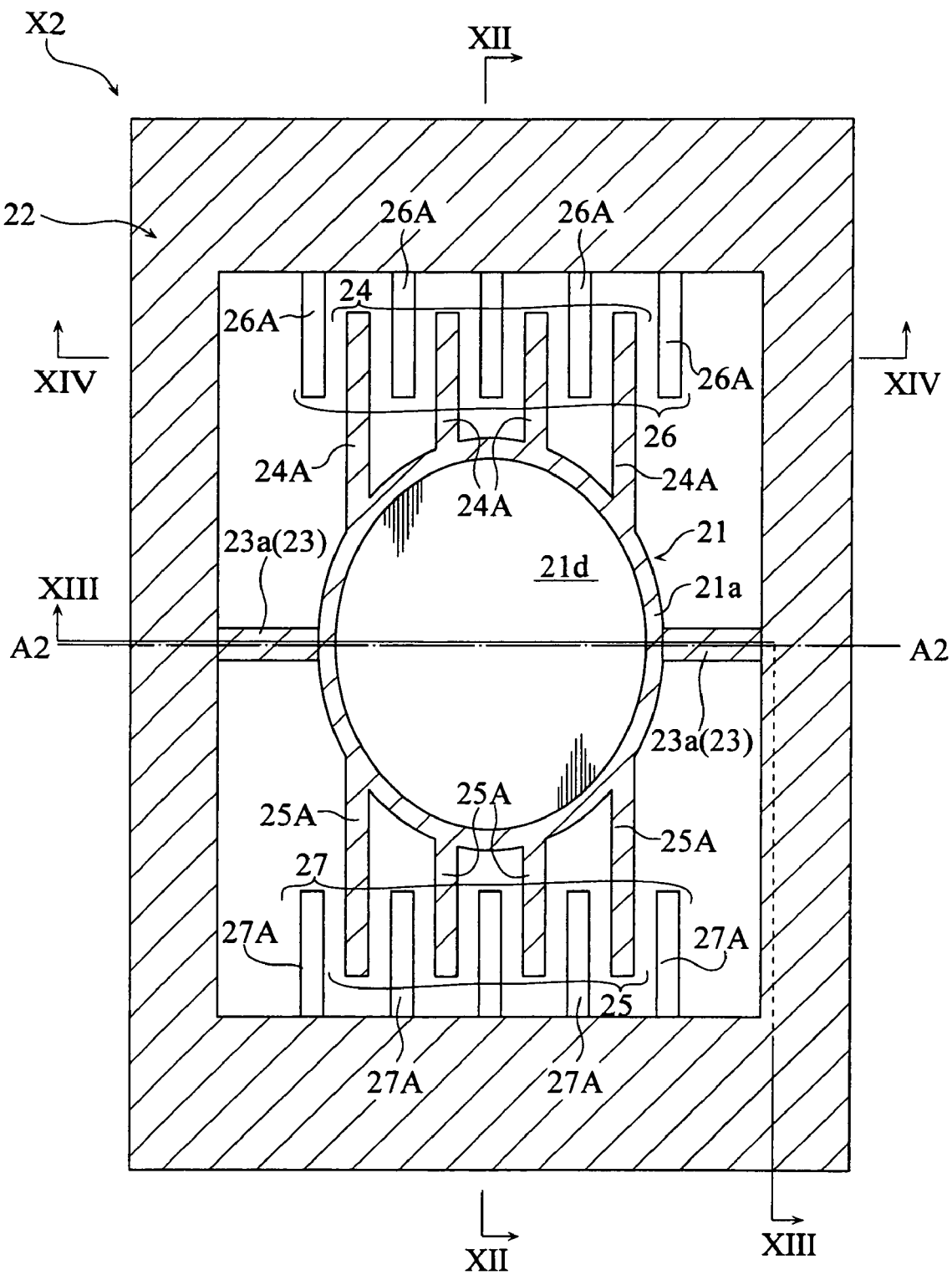
FIG. 10 is a front view of a micromirror element according to a second embodiment of the present invention.
Figure 11:
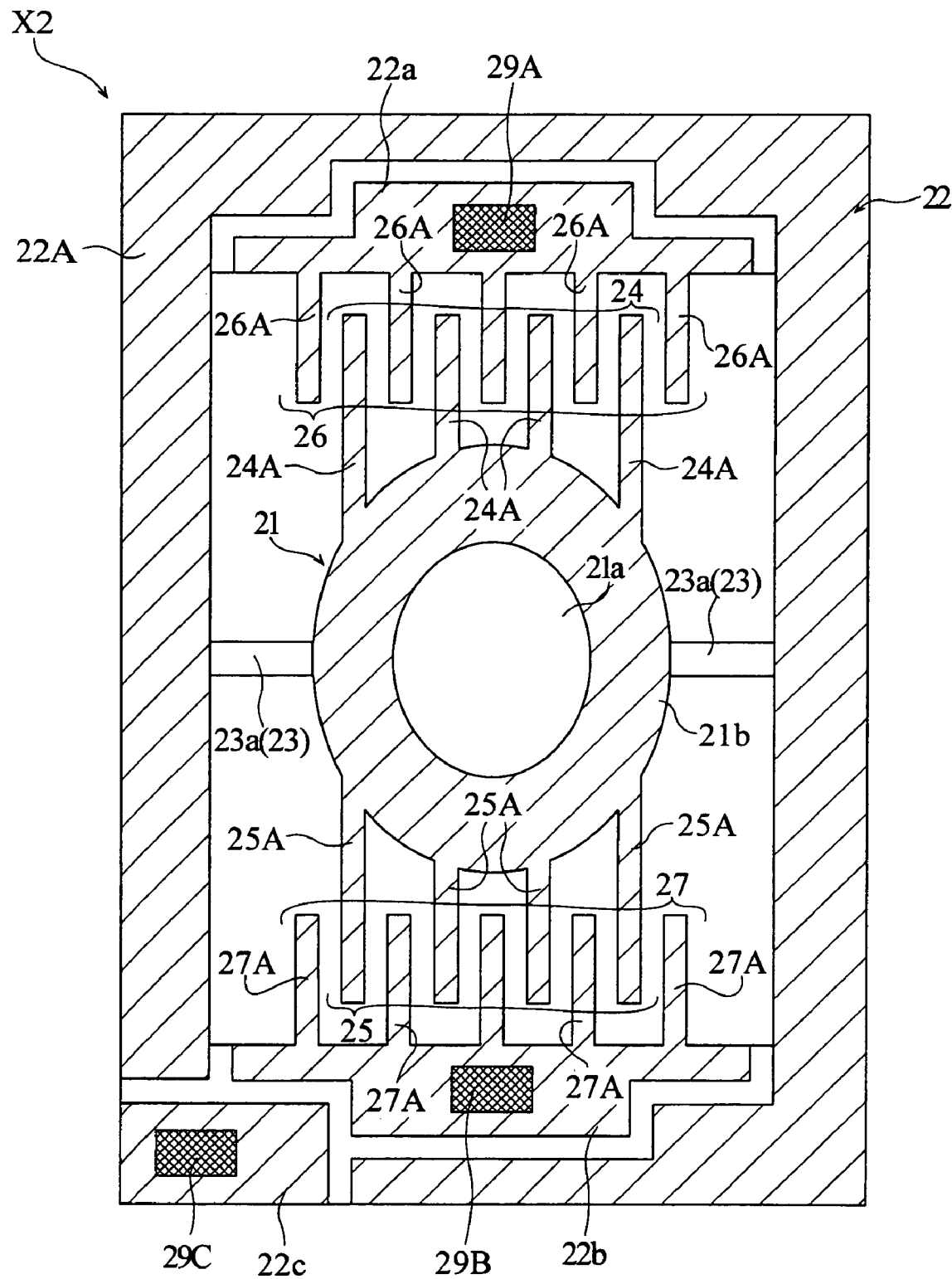
FIG. 11 is a rear view of the micromirror element according to the second embodiment of the present invention.
Figure 12:
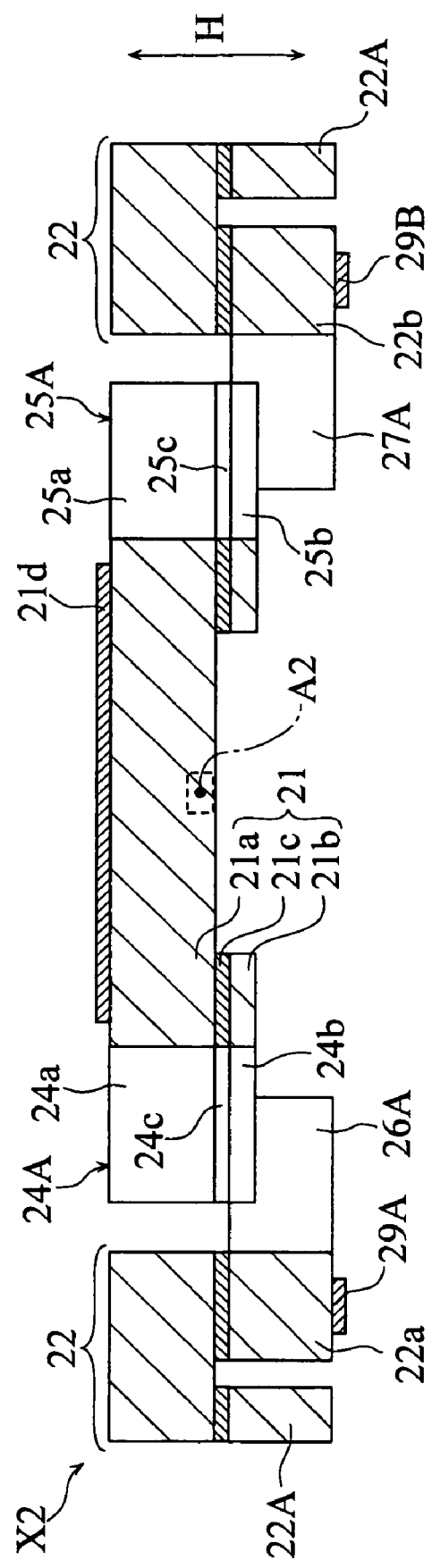
FIG. 12 is a sectional view taken in lines XII-XII in FIG. 10.
Figure 13:
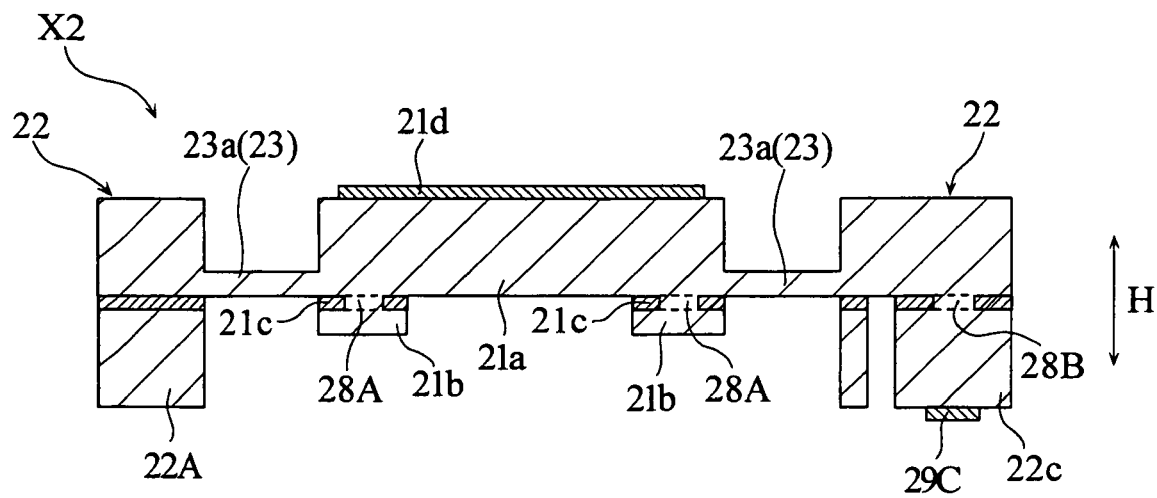
FIG. 13 is a sectional view taken in lines XIII-XIII in FIG. 10.
Figure 14:
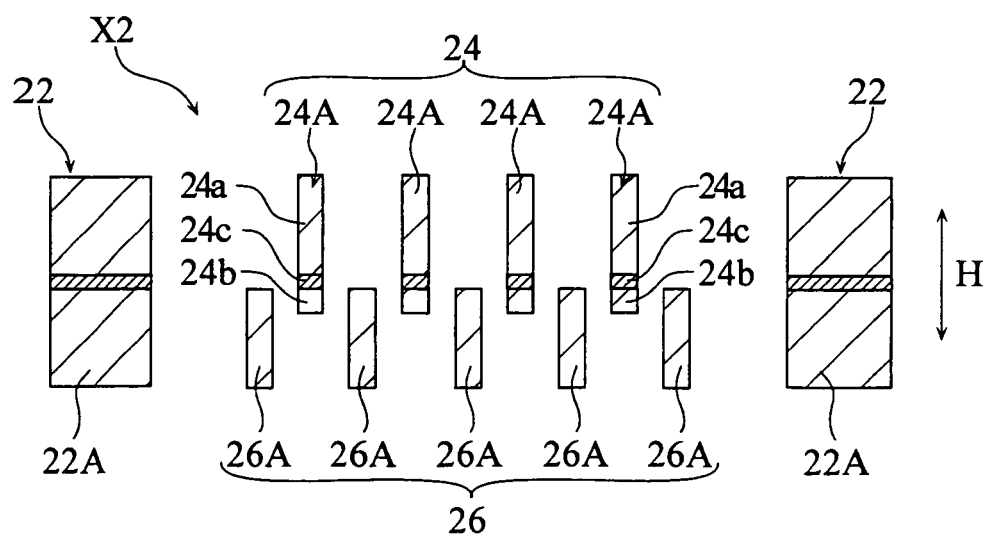
FIG. 14 is a sectional view taken in lines XIV-XIV in FIG. 10.

FIG. 10 through FIG. 14 show a micromirror element X2 according to a second embodiment of the present invention. FIG. 10 and FIG. 11 are a front view and a rear view of the micromirror element X2 respectively. FIG. 12 through FIG. 14 are sectional views taken in lines XII-XII, XIII-XIII, and XIV-XIV in FIG. 10 respectively.

The micromirror element X2 includes a mirror support 21, a frame 22, torsional joint 23 and comb-tooth electrodes 24, 25, 26, 27, and is manufactured by bulk micromachining technology which is a type of MEMS technology, from a material substrate provided by an SOI wafer. The material substrate has a laminate structure composed of a first and a second silicon layers and an insulation layer between the silicon layers. Each silicon layer is doped with impurity, and thereby given a predetermined level of electrical conductivity. Each of the above-mentioned portions in the micromirror element X2 is derived primarily from the first silicon layer and/or the second silicon layer. For the sake of viewing clarity, hatching is made in FIG. 10, to indicate regions which are derived from the first silicon layer and protruding higher than the insulation layer, above the paper surface toward the viewer. Likewise, hatching is made in FIG. 11, to indicate regions which are derived from the second silicon layer and protruding higher than the insulation layer, above the paper surface toward the viewer.

As clearly shown in FIG. 12, the mirror support 21 includes a first structure 21a which is derived from the first silicon layer, a second structure 21b which is derived from the second silicon layer and an insulation film 21c which is derived from the insulation layer and is sandwiched by the first structure 21a and the second structure 21b. As shown in FIG. 13, the first structure 21a and the second structure 21b are electrically connected with each other by a conduction path 28A which penetrates the insulation film 21c. The first structure 21a is provided with a mirror surface 21d which is capable of reflecting light. The mirror surface 21d has a laminate structure composed e.g. of a Cr layer formed on the first silicon layer and an Au layer formed thereon. The mirror support 21 and the mirror surface 21d as described above constitute a movable functional portion according to the present invention.

The frame 22 is derived primarily from the first and the second silicon layers, and as shown in FIG. 10 and FIG. 11, surrounds the mirror support 21. The portion of frame 12 derived from the second silicon layer has, as shown in FIG. 11 and FIG. 12, a main portion 22A and islands 22a, 22b, 22c which are spaced from the main portion. The islands 22a, 22b, 22c are provided with electrode pads 29A, 29B, 29C respectively. As shown in FIG. 13, the portion of frame 22 derived from the first silicon layer and the island 22c are electrically connected with each other by a conduction path 28B which penetrates the portion of frame 22 derived from the insulation layer (the hatched portions in FIG. 13 right above the main portion 22A and the island 22c).

The torsional joint 23 includes a pair of torsion bars 23a. Each of the torsion bars 23a is derived from the first silicon layer, and connects with the first structure 21a of the mirror support 21 as well as with the portion of frame 22 derived from the first silicon layer, thereby jointing the mirror support 21 with the frame 22. The torsion bars 23a provide electrical connection between the first structure 21a of the mirror support 21 and the portion of frame 22 derived from the first silicon layer. As shown in FIG. 13, in the present embodiment, the torsion bars 23a are thinner than the first structure 21a of the mirror support 21 and the portion of frame 22 derived from the first silicon layer in the thickness direction H of the element. Alternatively, the torsion bars 13a may have the same thickness as the first structure 21a of the mirror support 21 and the portion of frame 22 derived from the first silicon layer in the thickness direction H of the element. The torsional joint 13 or the torsion bars 13a as described here above provide a oscillating axis A2 for oscillating motion of the mirror support 21 or the movable functional portion. The oscillating axis A2 as such preferably passes through or near the center of gravity of the mirror support 21 or of the movable functional portion.

The comb-tooth electrode 24 includes a plurality of electrode teeth 24A. As shown in FIG. 10 and FIG. 11, all of the electrode teeth 24A extend from the mirror support 21 and are parallel to each other. Preferably, the direction in which the electrode teeth 24A extend is perpendicular to the direction in which the oscillating axis A2 extends. As shown in FIG. 12 and FIG. 14, each of the electrode teeth 24A has a laminate structure composed of a conductor 24a derived from the first silicon layer, a conductor 24b derived from the second silicon layer and an insulator 24c derived from the insulation layer and is between the conductors 24a, 24b. These conductors 24a, 24b and the insulator 24c stack one after another in the direction of oscillating motion of the movable functional portion. The conductor 24a is continuous to and electrically connected with the first structure 21a of the mirror support 21. The conductor 24b is continuous to and electrically connected with the second structure 21b of the mirror support 21. Therefore, the conductor 24a and the conductor 24b are electrically connected with each other via the first structure 21a, the conduction path 28A and the second structure 21b, of the mirror support 21. The insulator 24c is continuous to the insulation film 21c of the mirror support 21.

The comb-tooth electrode 25 includes a plurality of electrode teeth 25A. As shown in FIG. 10 and FIG. 11, all of the electrode teeth 25A extend from the mirror support 21 in a direction away from the direction in which the electrode teeth 24A extend, and are parallel to each other. Preferably, the direction in which the electrode teeth 25A extend is perpendicular to the direction in which the oscillating axis A2 extends. As shown in FIG. 12, each of the electrode teeth 25A has a laminate structure composed of a conductor 25a derived from the first silicon layer, a conductor 25b derived from the second silicon layer and an insulator 25c derived from the insulation layer and is between the conductors 25a, 25b. The conductor 25a is continuous to and electrically connected with the first structure 21a of the mirror support 21. The conductor 25b is continuous to and electrically connected with the second structure 21b of the mirror support 21. Therefore, the conductor 25a and the conductor 25b are electrically connected with each other via the first structure 21a, the conduction path 28A, and the second structure 21b, of the mirror support 21. The insulator 25c is continuous to the insulation film 21c of the mirror support 21. The comb-tooth electrode 25 or the electrode teeth 25A and the comb-tooth electrode 24 or the electrode teeth 24A as described above are electrically connected with each other via the mirror support 21.

The comb-tooth electrode 26, which works with the comb-tooth electrode 24 to generate electrostatic attraction (driving force), includes a plurality of electrode teeth 26A derived from the second silicon layer. As shown in FIG. 11 and FIG. 12, the electrode teeth 26A extend from the island 22a of the frame 22, and are parallel to each other.

The comb-tooth electrode 26 as described above constitutes a drive mechanism together with the comb-tooth electrode 24. As shown in FIG. 10 and FIG. 11, the electrode teeth 24A of the comb-tooth electrode 24 extend in parallel to the electrode teeth 26A of the comb-tooth electrode 26. As shown in FIG. 10, FIG. 11 and FIG. 14, the comb-tooth electrodes 24, 26 have their respective electrode teeth 24A, 26A offset from each other so that they will not hit each other when the mirror support 21 or the movable functional portion makes oscillating motion. During non-operation when the micromirror element X2 is not driven, as shown in FIG. 12 and FIG. 14, the electrode teeth 24A do not face the conductors 24a of the electrode teeth 24A, but face the conductors 24b. In other words, the comb-tooth electrode 24 or the electrode teeth 24A overlaps with the comb-tooth electrode 26 or the electrode teeth 26A in a thickness-wise direction H of the element. The electrode teeth 26A are longer than the conductors 24b of the electrode teeth 24A in the element's thickness-wise direction H.

The comb-tooth electrode 27, which works with the comb-tooth electrode 25 to generate electrostatic attraction (driving force), includes a plurality of electrode teeth 27A derived from the second silicon layer. As shown in FIG. 11 and FIG. 12, the electrode teeth 27A extend from the island 22b of the frame 22, and are parallel to each other.

The comb-tooth electrode 27 as described above constitutes a drive mechanism together with the comb-tooth electrode 25. As shown in FIG. 10 and FIG. 11, the electrode teeth 25A of the comb-tooth electrode 25 extend in parallel to the electrode teeth 27A of the comb-tooth electrode 27. The comb-tooth electrodes 25, 27 have their respective electrode teeth 25A, 27A offset from each other so that they will not hit each other when the mirror support 21 or the movable functional portion makes oscillating motion. During non-operation when the micromirror element X2 is not driven, as shown in FIG. 12 and FIG. 14, the electrode teeth 27A do not face the conductors 25a of the electrode teeth 25A, but face the conductors 25b. In other words, the comb-tooth electrode 25 or the electrode teeth 25A overlaps with the comb-tooth electrode 27 or the electrode teeth 27A in the thickness-wise direction H of the element. The electrode teeth 27A are longer than the conductors 25b of the electrode teeth 25A in the element's thickness-wise direction H.

FIG. 15 through FIG. 17 show a method of manufacturing the micromirror element X2. The method is an example through which the micromirror element X2 is manufactured by bulk micromachining technology. Throughout FIG. 15 to FIG. 17, views of a section will be given to illustrate a process of forming those components which are shown in FIG. 17D, i.e. a mirror support M, frames F1, F2, torsion bars T1, T2, and a pair of comb-tooth electrodes E1, E2. The section represents a section of a material substrate (a wafer having a multi-layer structure) to which micromachining is performed, and more specifically a section of a single block from which a single micromirror element is formed. The section includes sections of a plurality of component regions, and the sectional views are illustrative sequential depictions. The mirror support M represents part of the mirror support 21. The frames F1, F2 represent the frame 22, shown in selected sections thereof. The torsion bar T1 represents the torsion bars 23a, and is expressed in a cross section of the torsion bar 23a. The torsion bar T2 represents the torsion bars 23a, and is expressed in a longitudinal section of the torsion bars 23a. The comb-tooth electrode E1 represents part of the comb-tooth electrodes 24, 25, and is expressed in a cross section of the electrode teeth 24A, 25A. The comb-tooth electrode E2 represents part of the comb-tooth electrodes 26, 27, and is expressed in a cross section of the electrode teeth 26A, 27A.

Figure 15A:
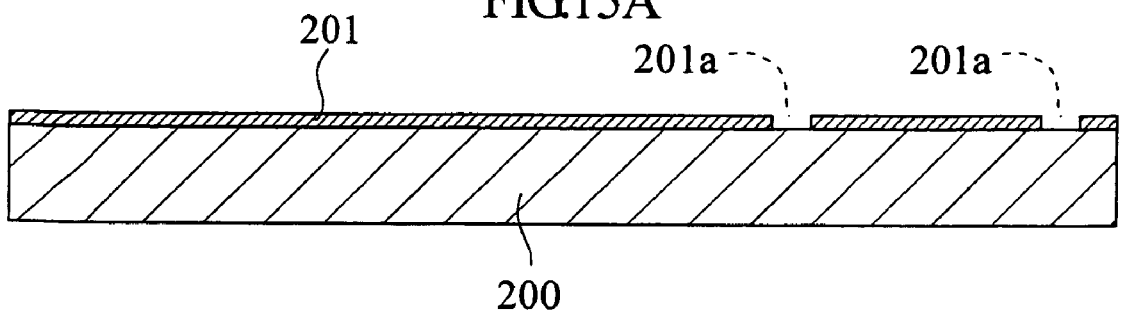
FIGS. 15A-15E show several steps of a method for manufacture of the micromirror element according to the second embodiment.

In the manufacture of the micromirror element X2, first, as shown in FIG. 15A, an oxide film pattern 201 is formed on a silicon substrate 200. In the present embodiment, the silicon substrate 200 is a wafer of silicon which is doped with P or Sb thereby rendered electrically conductive. The substrate has a thickness of e.g. 200 μm. The oxide film pattern 201 has openings 201a for formation of the conduction paths.

Figure 15B:
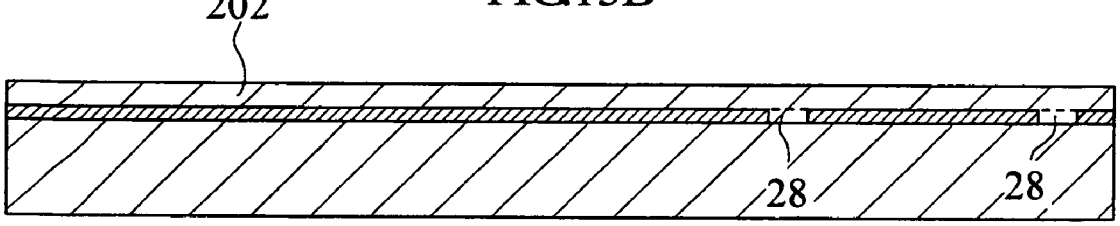

Next, by using CVD method for example, polysilicon is supplied to the silicon substrate 200, from above the oxide film pattern 201, whereby conduction paths 28 are formed in the openings 201a as shown in FIG. 15B. At the same time, a polysilicon layer 202 is formed on the oxide film pattern 201. Since polysilicon layer 202 will make an undulated surface as it grows, it is preferable that the exposed surface of polysilicon layer 202 is polished flat by CMP method, after the film is formed. During the CVD, the conduction paths 28 and the polysilicon layer 202 are doped with P thereby rendered electrically conductive. The conduction paths 28 represent the conduction paths 28A, 28B. The polysilicon layer 202 has a thickness equal to the thickness of the torsion bars T1, T2 (e.g. 5 μm) which are the target structure to be formed. In the material substrate after this step, the silicon substrate 200 and the polysilicon layer 202 are electrically connected with each other via the conduction paths 28.

Figure 15C:
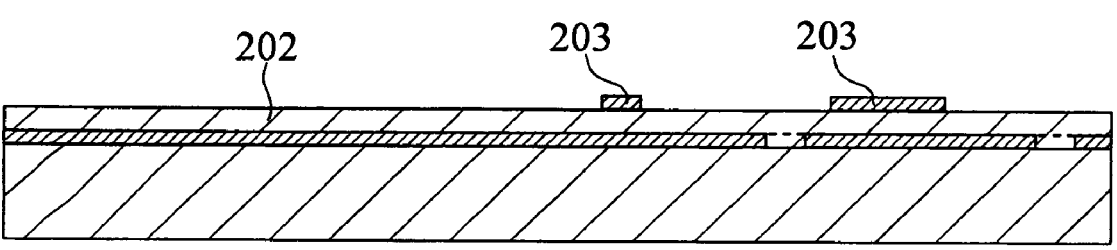

Next, as shown in FIG. 15C, an oxide film pattern 203 is formed on the polysilicon layer 202. The oxide film pattern 203 has a pattern corresponding to the shape of torsion bars T1, T2.

Figure 15D:
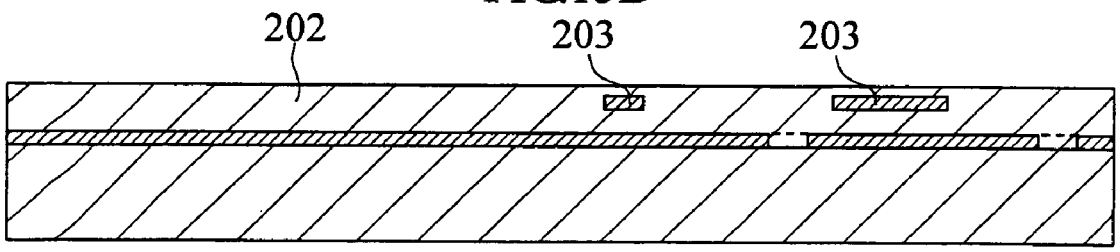

Next, as shown in FIG. 15D, by using CVD method for example, additional polysilicon is supplied to the silicon substrate 200 from above the oxide film pattern 203, whereby the oxide film pattern 203 is buried into the polysilicon layer 202.

Figure 15E:
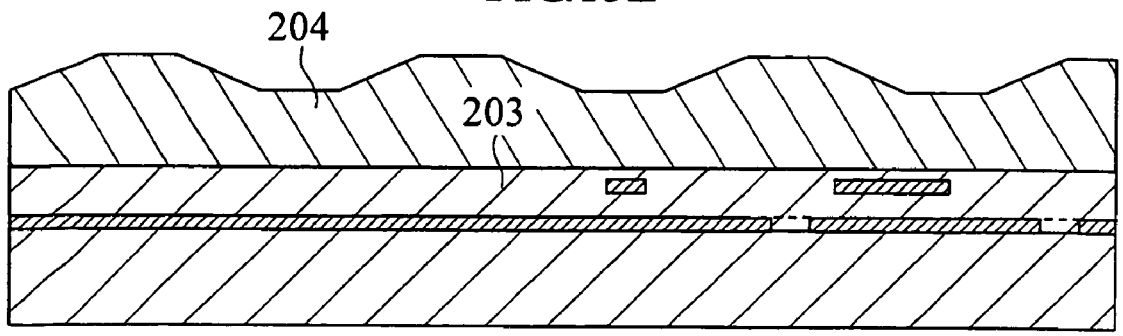

Next, as shown in FIG. 15E, epitaxial growth method is used to form a polysilicon layer 204 on the polysilicon layer 203. In the present embodiment, the polysilicon layer 204 is rendered electrically conductive by doping with P during the epitaxial growth, and has a thickness of 100 μm approx. from the surface of the polysilicon layer 203. During this step, the surface of the polysilicon layer 204 becomes undulated relatively severely.

Figure 16A:
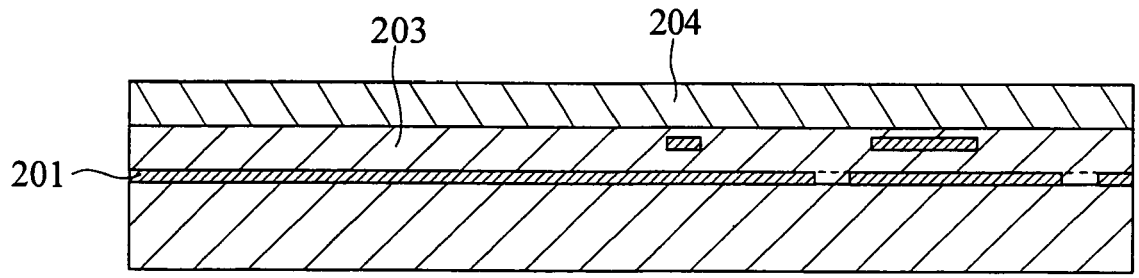
FIGS. 16A-16D show steps following those in FIG. 15.

Next, as shown in FIG. 16A, the surface of the polysilicon layer 204 is ground and then mirror-polished thereafter. After this step, a total thickness of the polysilicon layer 203 and the polysilicon layer 204 on the oxide film pattern 201 is 60 μm for example.

Figure 16B:
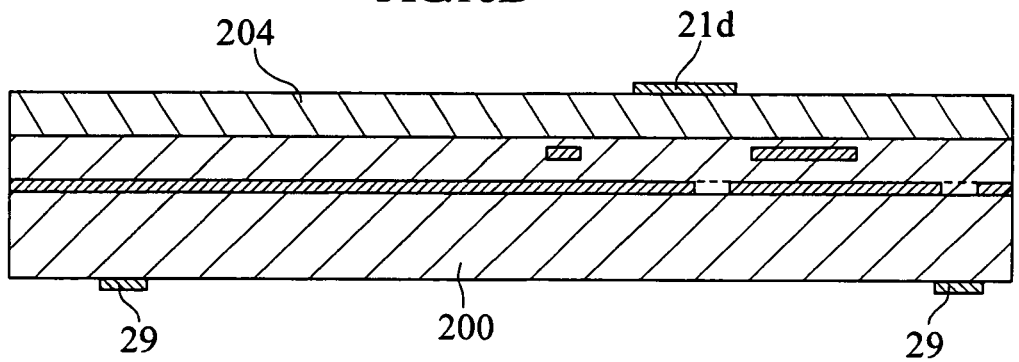

Next, as shown in FIG. 16B, a mirror surface 21d is formed on the polysilicon layer 204, and electrode pads 29 are formed on the silicon substrate 200. In forming the mirror surface 21d on the polysilicon layer 204, first, spattering method is used to form a film of e.g. Cr (50 nm) and then of Au (200 nm) on the silicon layer 204. Next, pattern formation is made by etching these metal films sequentially with predetermined masks, to pattern the mirror surface 21d. The formation of the electrode pad 29 on the silicon substrate 200 is performed in the same way as of the mirror surface 21d on the polysilicon layer 204. The electrode pads 29 on the silicon substrate 200 represent the electrode pads 29A, 29B, 29C described earlier.

Figure 16C:
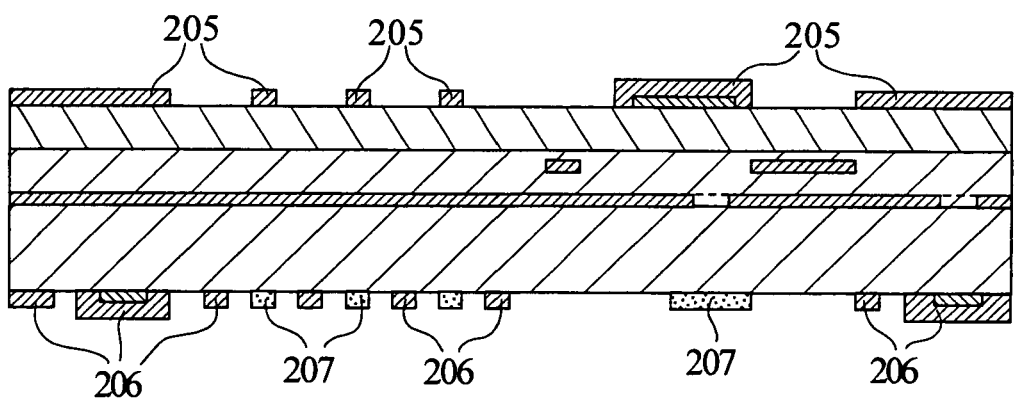

In the manufacture of the micromirror element X2, next, as shown in FIG. 16C, an oxide film pattern 205 is formed on the polysilicon layer 204, and an oxide film pattern 206 and a resist pattern 207 are formed on the silicon substrate 200. The oxide film pattern 205 has a pattern corresponding to the mirror support M (mirror support 21), the frames F1, F2 (frame 22), and the comb-tooth electrode E1 (comb-tooth electrodes 24, 25). The oxide film pattern 206 has a pattern corresponding to the frames F1, F2 (frame 22) and the comb-tooth electrode E2 (comb-tooth electrodes 26, 27). The resist pattern 207 has a pattern corresponding to part of the mirror support M (second structure 21b of mirror support 21) and the comb-tooth electrode E1 (comb-tooth electrodes 24, 25).

Figure 16D:
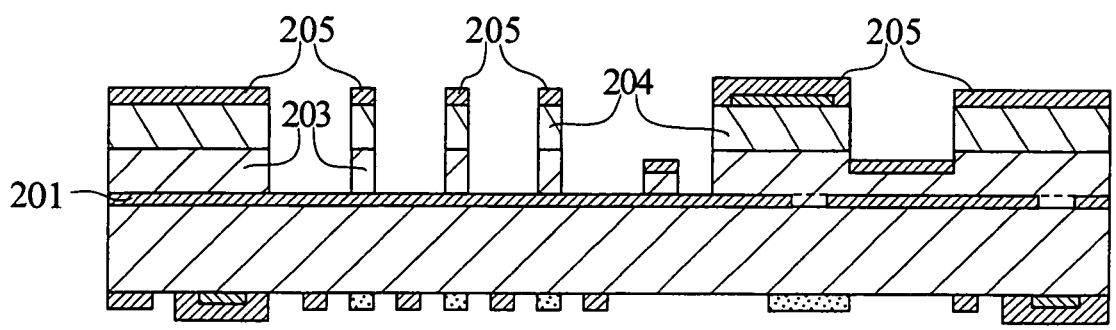

Next, as shown in FIG. 16D, anisotropic etching by DRIE is performed to the polysilicon layer 204 and the silicon layer 203 using the oxide film pattern 205 as a mask. This etching yields part of the mirror support M (mirror support 21), part of the comb-tooth electrode E1 (comb-tooth electrodes 24, 25), the torsion bars T1, T2 (torsion bars 23a), and the frames F1, F2 (frame 22).

Figure 17A:
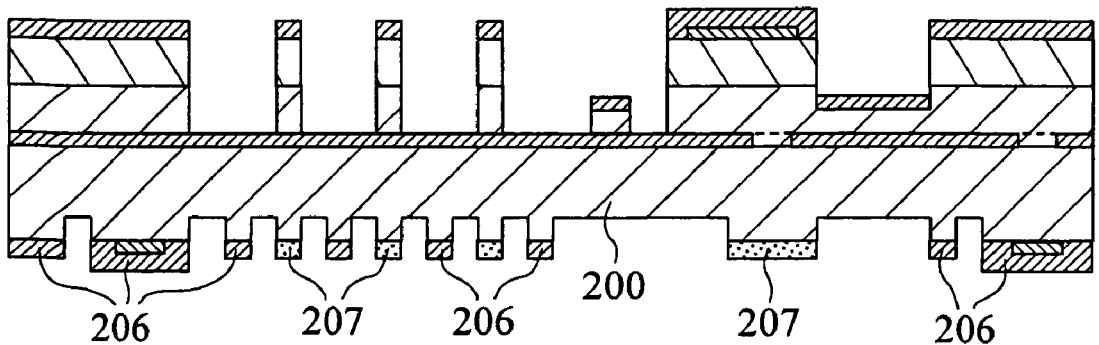
FIGS. 17A-17D show steps following those in FIG. 16.

Next, as shown in FIG. 17A, anisotropic etching by DRIE is performed to the silicon substrate 200 using the oxide film pattern 206 and the resist pattern 207 as masks, to a predetermined depth. The predetermined depth is a depth corresponding to the thickness of the second structure 21b of the mirror support 21, and the length in the element's thickness direction of the conductors 24b, 25b of the electrode teeth 24A, 25A, and is 5 μm for example.

Figure 17B:
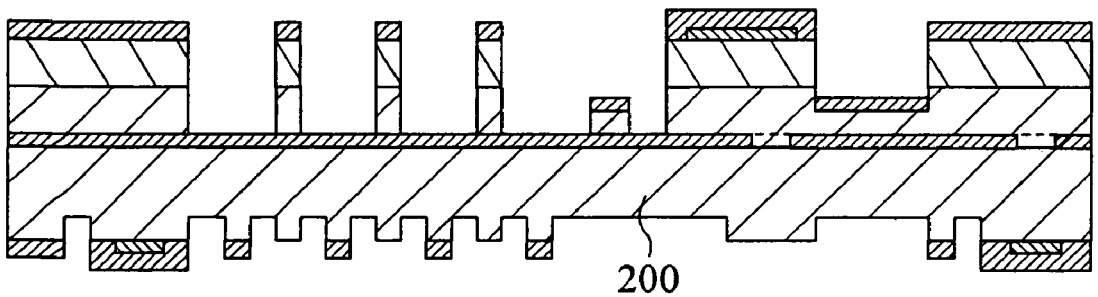
Figure 17C:
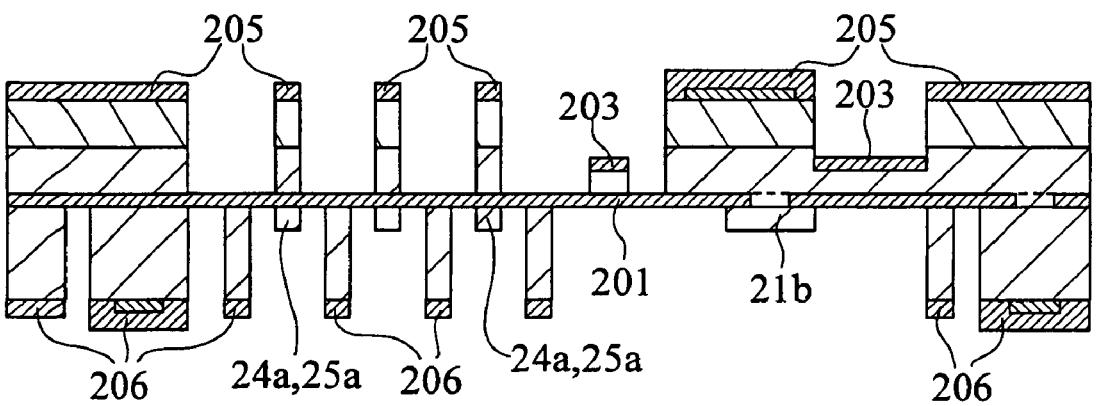
Figure 17D:
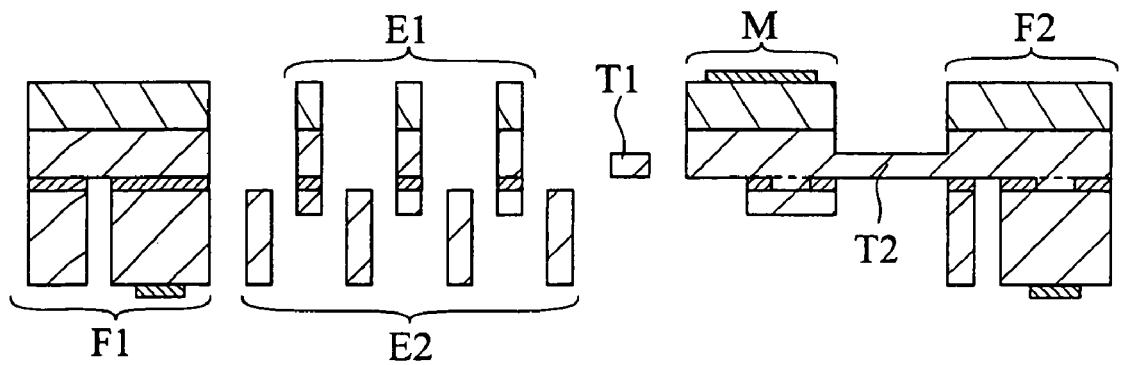

Next, as shown in FIG. 17D, the resist pattern 207 is removed with a remover. The remover may be AZ Remover 700 (made by Clariant Japan).

Next, as shown in FIG. 17B, anisotropic etching by DRIE is performed to the silicon substrate 200 using the oxide film pattern 206 as a mask, to leave the second structure 21b of the mirror support 21 and the conductors 24b, 25b of the electrode teeth 24A, 25A in the comb-tooth electrodes 24, 25, and until the oxide film pattern 201 is reached. This etching process yields part of the mirror support M (mirror support 21), part of the comb-tooth electrode E1 (comb-tooth electrodes 24, 25), part of the comb-tooth electrode E2 (comb-tooth electrodes 26, 27), and part of the frames F1, F2 (frame 22).

Next, as shown in FIG. 17D, exposed portions in the oxide film pattern 201, and oxide film patterns 203, 205, 206 are removed by etching. The removal can be achieved by dry etching or wet etching.

The above-described series of steps yield the mirror support M, the frames F1, F2, the torsion bars T1, T2 and the comb-tooth electrodes E1, E2, whereby the micromirror element X2 is manufactured.

In the micromirror element X2, by applying a predetermined voltage to the comb-tooth electrodes 24, 25, 26, 27 as required, it is possible to move the mirror support 21 or the movable functional portion about the oscillating axis A2. Voltage application to the comb-tooth electrodes 24, 25 can be achieved via the electrode pad 29C, the island 22c, the conduction path 28B, the portion of frame 22 derived from the first silicon layer, the torsional joint (both of the torsion bars 23a), as well as the first structure 21a, the conduction path 28A and the second structure 21b of the mirror support 21.

The comb-tooth electrodes 24, 25 are grounded for example. On the other hand, voltage application to the comb-tooth electrode 26 can be achieved via the electrode pad 29A and the island 22a of the frame 22. Voltage application to the comb-tooth electrode 27 can be achieved via the electrode pad 29B and the island 22b of the frame 22. In the portion of frame 22 derived from the second silicon layer, the island 22a where the electrode pad 29A is connected is electrically separated from the island 22b where the electrode pad 29B is connected. Therefore, voltage application to the comb-tooth electrodes 26, 27 can be made independently from each other.

Figure 18:
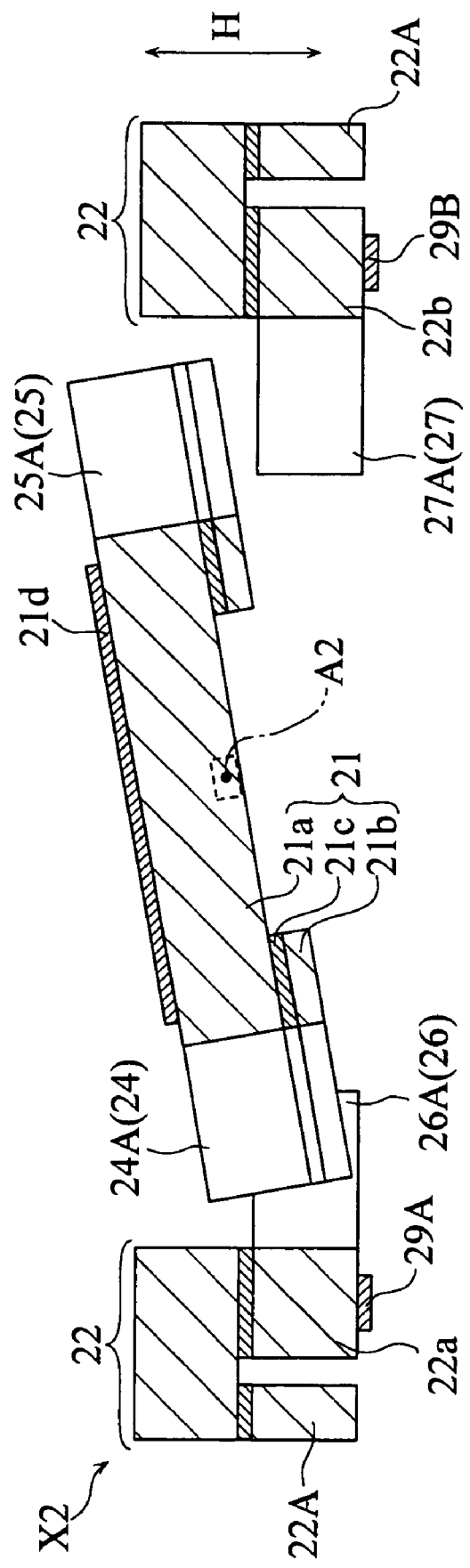
FIG. 18 is a sectional view during operation taken in lines XII-XII in FIG. 10.

When a desired static electrical attraction is generated between the comb-tooth electrodes 24, 26 by applying a predetermined voltage to each of the comb-tooth electrodes 24, 26, the comb-tooth electrode 24 is drawn in the comb-tooth electrode 26. This causes the mirror support 21 or the movable functional portion to pivot about the oscillating axis A2, achieving a rotational displacement as shown in FIG. 18 for example, to an angle where the electrostatic attraction balances with the sum of torsional resistance forces in the torsion bars 23a. In the oscillating motion as described, the amount of rotational displacement can be adjusted by adjusting the voltage applied to the comb-tooth electrodes 24, 26. When the electrostatic attraction between the comb-tooth electrodes 24, 26 is ceased, each of the torsion bars 23a comes back to its natural state, bringing the mirror support 21 or the movable functional portion to an attitude shown in FIG. 12.

On the other hand, when a desired static electrical attraction is generated between the comb-tooth electrode 25, 27 by applying a predetermined voltage to each of the comb-tooth electrodes 25, 27, the comb-tooth electrode 25 is drawn in the comb-tooth electrode 27. This causes the mirror support 21 or the movable functional portion to pivot about the oscillating axis A2, achieving a rotational displacement, to an angle where the electrostatic attraction balances with the sum of torsional resistance forces in the torsion bars 23a. In the oscillating motion as described, the amount of rotational displacement can be adjusted by adjusting the voltage applied to the comb-tooth electrodes 25, 27. When the electrostatic attraction between the comb-tooth electrodes 25, 27 is ceased, each of the torsion bars 23a comes back to its natural state, bringing the mirror support 21 or the movable functional portion to the attitude shown in FIG. 12.

Through the oscillating drive of the mirror support 21 or the movable functional portion as described above, it is possible to appropriately switch light reflecting directions in which light is reflected by the mirror surface 21d provided on the mirror support 21.

In the micromirror element X2, even when the movable functional portion (mirror support 21, mirror surface 21d) has a rotational displacement of 0° as shown in FIG. 12, the conductor 24b of each electrode tooth 24A in the comb-tooth electrode 24 faces its corresponding electrode tooth 26A in the comb-tooth electrode 26, whereas the conductor 25b of each electrode tooth 25A in the comb-tooth electrode 25 faces its corresponding electrode tooth 27A in the comb-tooth electrode 27. In other words, even when the movable functional portion has a rotational displacement of 0°, the comb-tooth electrodes 24, 26 overlap with each other in the element thickness direction H, and the comb-tooth electrodes 25, 27 overlap with each other in the element thickness direction H. When a predetermined voltage is applied to the comb-tooth electrode 24, the conductor 24a and the conductor 24b which are electrically connected with each other within the same one of the electrode teeth 24A assume the same voltage. Likewise, when a predetermined voltage is applied to the comb-tooth electrode 25, the conductor 25a and the conductor 25b which are electrically connected with each other within the same one of the electrode teeth 25A assume the same voltage. Therefore, in the micromirror element X2, even when the rotational displacement of the movable functional portion is 0°, application of a predetermined voltage to the comb-tooth electrodes 24, 26 generates effective electrostatic attraction between the comb-tooth electrodes 24, 26, and application of a predetermined voltage to the comb-tooth electrodes 25, 27 generates effective electrostatic attraction between the comb-tooth electrodes 25, 27. Therefore, when moving the movable functional portion from the rotational displacement of 0° by generating electrostatic attraction between the comb-tooth electrodes 24, 26 or between the comb-tooth electrode 25, 27 in the micromirror element X2, it is easy to achieve sufficient response in the movement. On the other hand, when stopping the movable functional portion at the rotational displacement of 0°, it is possible to control electrostatic attraction between the comb-tooth electrodes 24, 26 or between the comb-tooth electrode 25, 27 highly accurately near the stopping position. Therefore, it is easy to stop the movable functional portion quickly, by reducing residual oscillating motion of the movable functional portion near the rotational displacement of 0°.

During the operation of the micromirror element X2, when the rotational displacement of the movable functional portion is not close to 0°, each of the electrode teeth 26A in the comb-tooth electrode 26 faces not only the conductor 24b but also the conductor 24a of the comb-tooth electrode 24, generating effective electrostatic attraction between the comb-tooth electrodes 24, 26. Otherwise, each of the electrode teeth 27A in the comb-tooth electrode 27 faces not only the conductor 25b but also the conductor 25a of the comb-tooth electrode 25, generating effective electrostatic attraction between the comb-tooth electrodes 25, 27.

In addition, in the micromirror element X2, the electrode teeth 26A of the comb-tooth electrode 26 are longer in the direction of oscillating motion, than the conductors 24b of the electrode teeth 24A in the comb-tooth electrode 26. Further, the electrode teeth 27A of the comb-tooth electrode 27 are longer in the direction of oscillating motion, than the conductors 25b of the electrode teeth 25A in the comb-tooth electrode 25. Such an arrangement is suitable for generation of effective electrostatic attraction in that the area of opposed surfaces between the comb-tooth electrodes 24, 26 or between the comb-tooth electrodes 25, 27 changes as the movable functional portion pivots.

As described above, the micromirror element X2 has superb controllability over the entire range of oscillating motion of the movable functional portion including the starting and stopping operations. The micromirror element X2 is suitable for quick and accurate operation of the movable functional portion.

Further, according to the method of manufacturing the micromirror element X2 described above, highly accurate control is possible over the overlapping dimension in the element thickness direction H between the comb-tooth electrode 24 or the electrode teeth 24A and the comb-tooth electrode 26 or the electrode teeth 26A, as well as the overlapping dimension in the element thickness direction H between the comb-tooth electrode 25 or the electrode teeth 25A and the comb-tooth electrode 27 or the electrode teeth 27A. This is because the comb-tooth electrode E2 (comb-tooth electrodes 26, 27) is formed to a high level of accuracy in the element thickness direction H, in the etching process described with reference to FIG. 17B, where the comb-tooth electrode E2 (comb-tooth electrodes 26, 27) is formed by utilizing the oxide film pattern 201 which serves as an etch stop layer.

Figure 19:
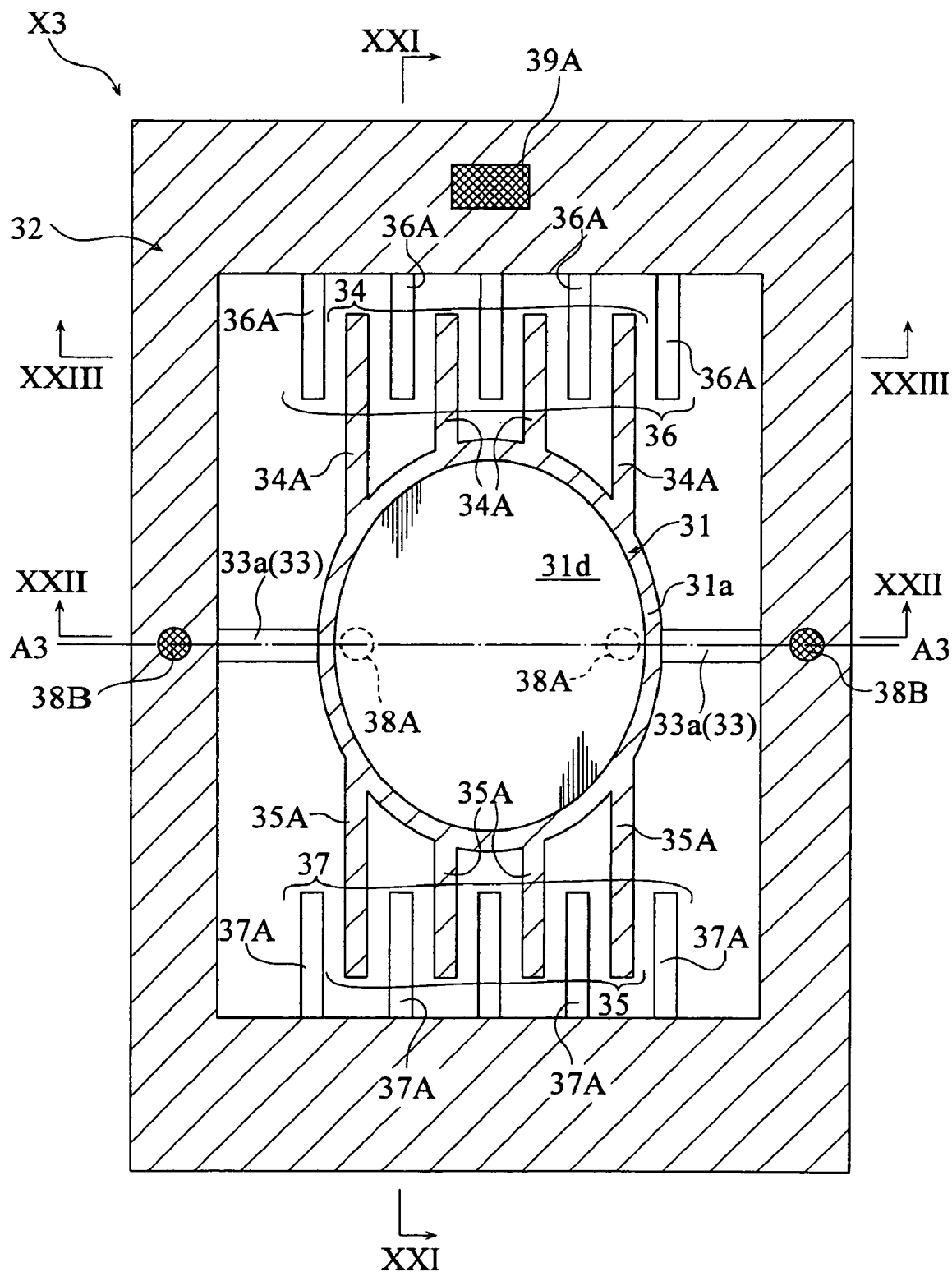
FIG. 19 is a plan view of a micromirror element according to a third embodiment of the present invention.
Figure 20:
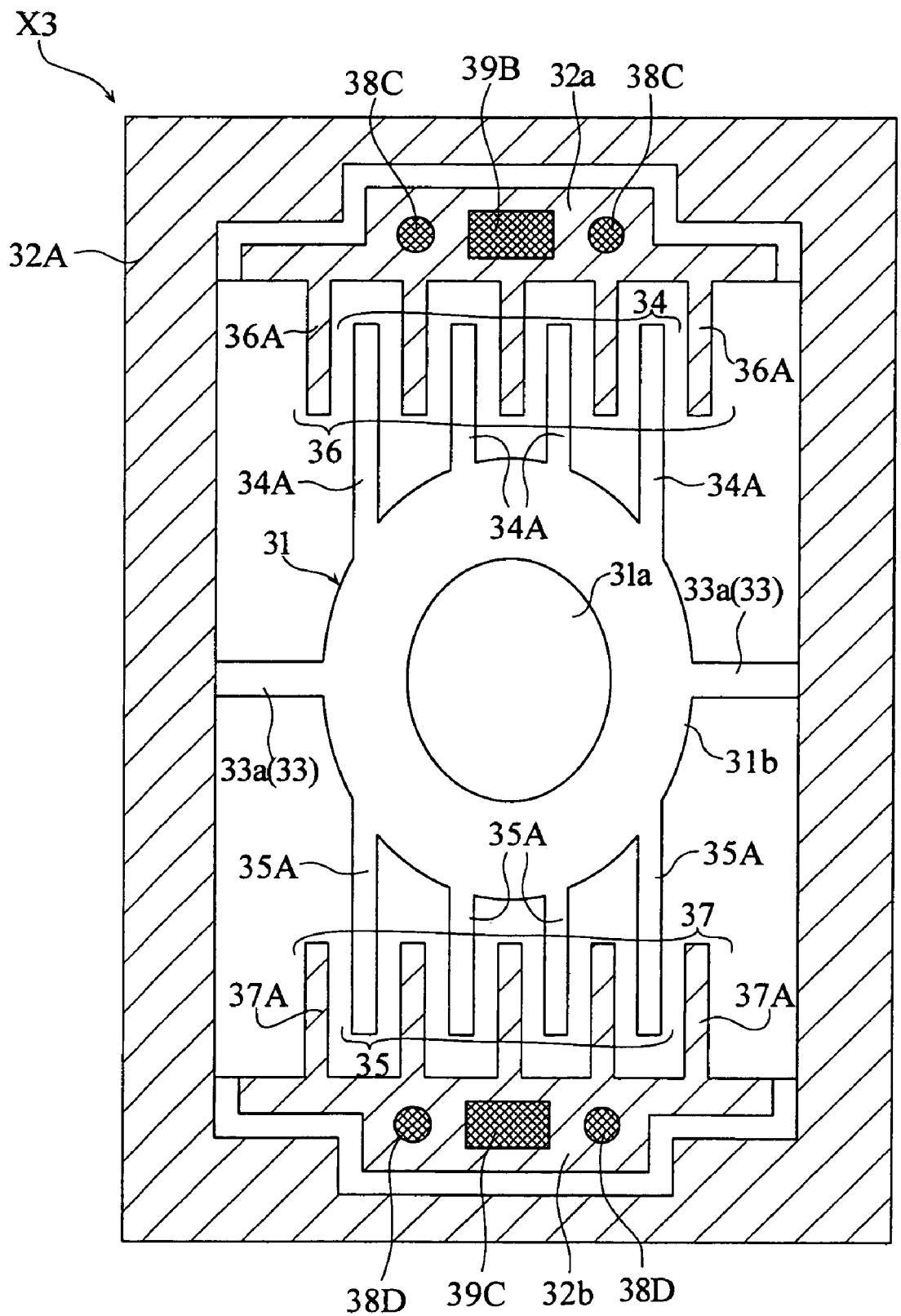
FIG. 20 is a rear view of the micromirror element according to the third embodiment of the present invention.
Figure 21:
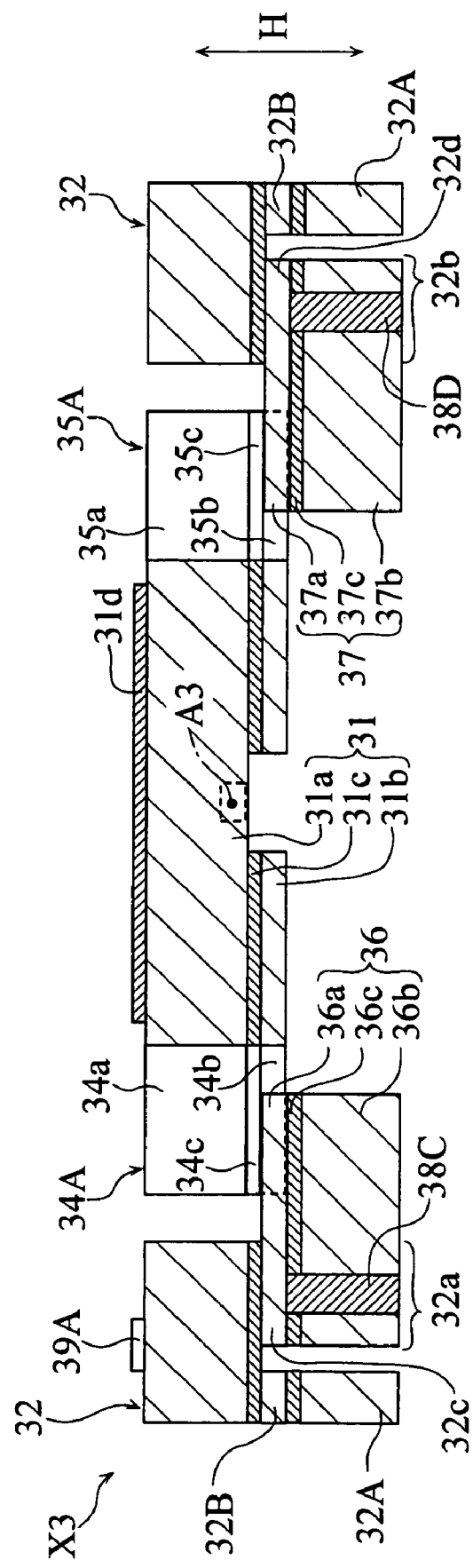
FIG. 21 is a sectional view taken in lines XXI-XXI in FIG. 19.
Figure 22:
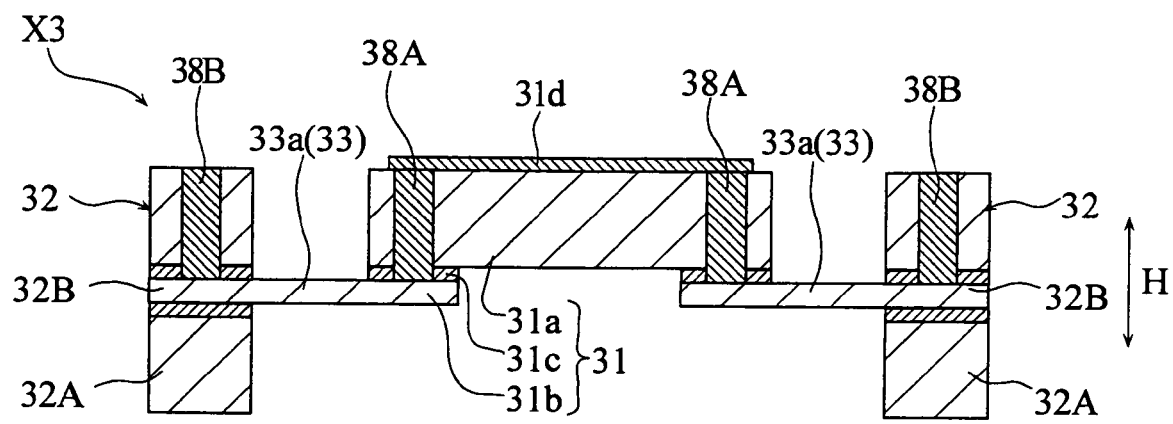
FIG. 22 is a sectional view taken in lines XXII-XXII in FIG. 19.
Figure 23:
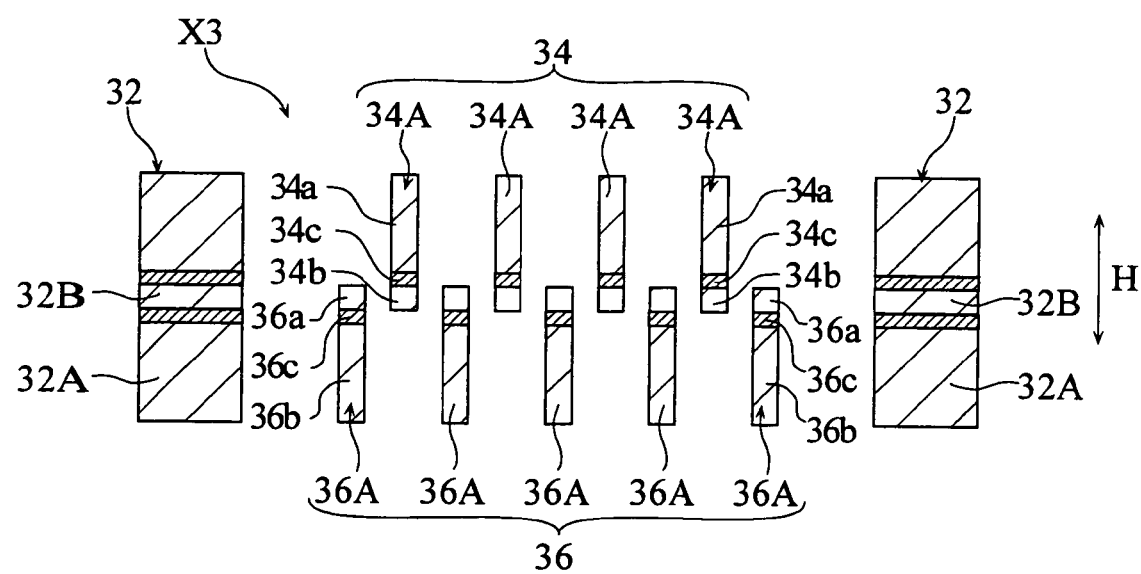
FIG. 23 is a sectional view taken in lines XXIII-XXIII in FIG. 19.

FIG. 19 through FIG. 23 show a micromirror element X3 according to a third embodiment of the present invention. FIG. 19 and FIG. 20 are a front view and a rear view respectively of the micromirror element X3. FIG. 21 through FIG. 23 are sectional views taken in lines XXI-XXI, XXII-XXII, and XXIII-XXIII in FIG. 19, respectively.

The micromirror element X3 includes a mirror support 31, a frame 32, a torsional joint 33 and comb-tooth electrodes 34, 35, 36, 37, and is manufactured by bulk micromachining technology such as MEMS technology, from a material substrate provided by a multi-layer SOI wafer. The material substrate has a laminate structure composed of a first through a third silicon layers, a first insulation layer between the first and the second silicon layers, and a second insulation layer between the second and the third silicon layers. Each silicon layer is doped with impurity, and thereby given a predetermined level of electrical conductivity. For the sake of viewing clarity, hatching is made in FIG. 19, to indicate regions which are derived from the first silicon layer and protruding higher than the first insulation layer, above the paper surface toward the viewer. Likewise, hatching is made in FIG. 20, to indicate regions which are derived from the third silicon layer and protruding higher than the second insulation layer, above the paper surface toward the viewer.

As clearly shown in FIG. 21, the mirror support 31 includes a first structure 31a which is derived from the first silicon layer, a second structure 31b which is derived from the second silicon layer and an insulation film 31c which is derived from the insulation layer and is sandwiched by the first structure 31a and the second structure 31b. As shown in FIG. 22, the first structure 31a and the second structure 31b are electrically connected with each other by a conduction plug 38A which penetrates the insulation film 31c.

Figure 24:
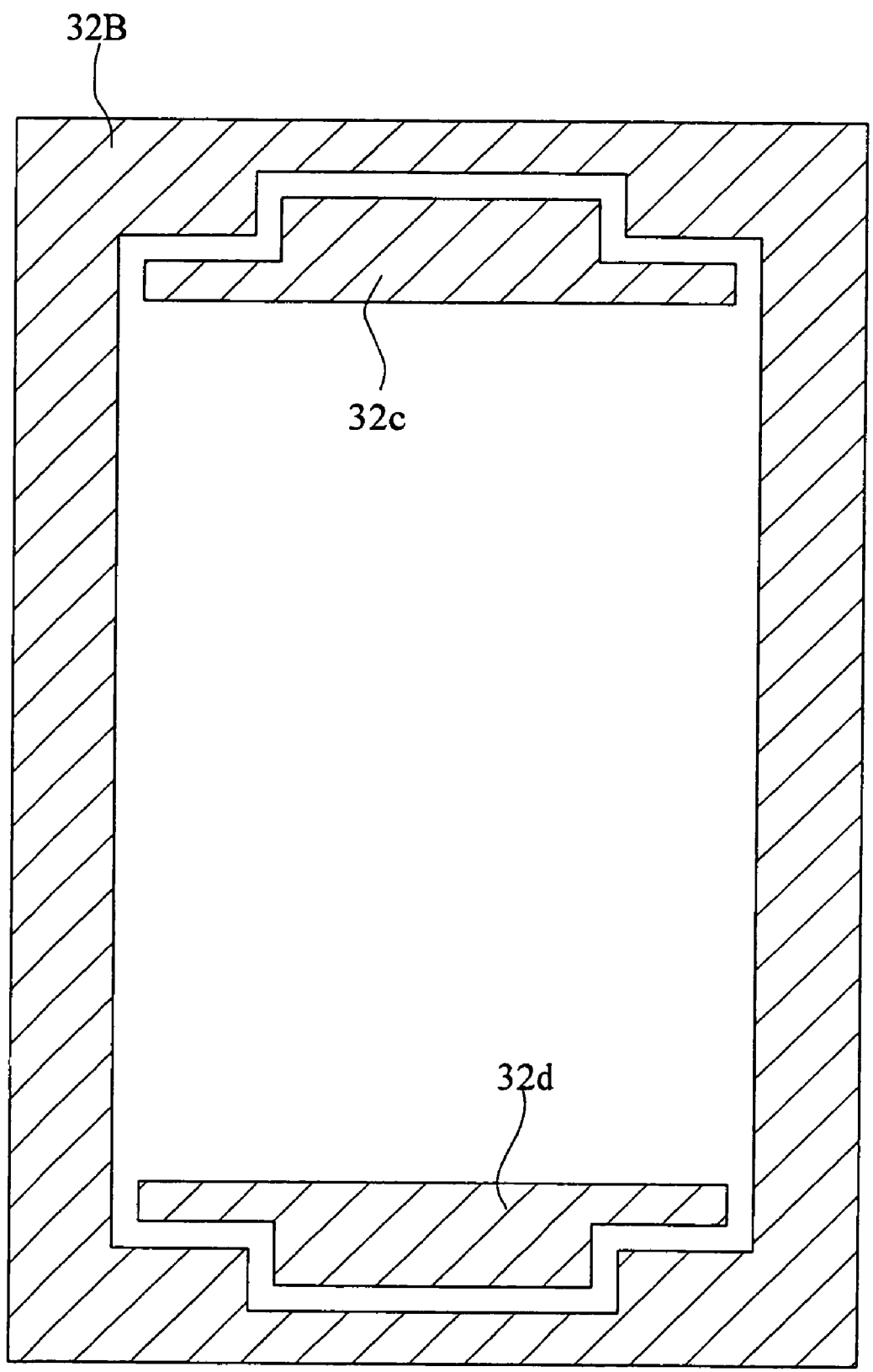
FIG. 24 is a plan view of the micromirror element in FIG. 19, showing a portion of a frame derived from a second silicon layer.

The frame 32 is derived primarily from the first through the third silicon layers, and as shown in FIG. 19 and FIG. 20, surrounds the mirror support 31. The portion of frame 32 derived from the third silicon layer includes, as shown in FIG. 20 and FIG. 21, a main portion 32A and islands 32a, 32b which are spaced from the main portion. The portion of frame 32 derived from the second silicon layer has the same pattern as the portion derived from the third silicon layer, and includes, as shown in FIG. 24, a main portion 32B and islands 32c, 32d which are spaced from the main portion.

In the frame 32 as described, as shown in FIG. 19, an electrode pad 39A is provided on the portion derived from the first silicon layer. As shown in FIG. 22, the portion derived from the first silicon layer is electrically connected with the main portion 32B via the conduction plug 38B which penetrates the portion derived from the first insulation layer (the hatched region in FIG. 21 right below the portion of frame 32 derived from the first silicon layer). Further, as shown in FIG. 20, the island 32a, 32b are provided with electrode pads 39B, 39C respectively. As shown in FIG. 21, the island 32a is electrically connected with the island 32c via the conduction plug 38C which penetrates the portion derived from the second insulation layer (the hatched region in FIG. 21 right below the portion derived from the second silicon layer). The island 32b is electrically connected with the island 32d via the conduction plug 38D which penetrates the portion derived from the second insulation layer.

The torsional joint 33 includes a pair of torsion bars 33a. Each of the torsion bars 33a is derived from the second silicon layer, and as shown in FIG. 22, connects with the second structure 31b of the mirror support 31 as well as with the main portion 32B of the frame 32, thereby jointing them. The torsion bars 33a provide electrical connection between the second structure 31b of the mirror support 31 and with the main portion 32B of the frame 32. The torsion bars 33a are thinner than the mirror support 31 and the frame 32 in the thickness direction H of the element. The torsional joint 33 or the torsion bars 33a as described above provide a oscillating axis A3 for oscillating motion of the mirror support 31 or the movable functional portion. The oscillating axis A3 as such preferably passes through or near the center of gravity of the mirror support 31 or of the movable functional portion.

The comb-tooth electrode 34 includes a plurality of electrode teeth 34A. As shown in FIG. 19 and FIG. 20, all of the electrode teeth 34A extend from the mirror support 31 and are parallel to each other. Preferably, the direction in which the electrode teeth 34A extend is perpendicular to the direction in which the oscillating axis A3 extends. As shown in FIG. 21 and FIG. 23, each of the electrode teeth 34A has a laminate structure composed of a conductor 34a derived from the first silicon layer, a conductor 34b derived from the second silicon layer and an insulator 34c derived from the first insulation layer and is between the conductors 34a, 34b. These conductors 34a, 34b and the insulator 34c stack one after another in the direction of oscillating motion of the movable functional portion. The conductor 34a is continuous to and electrically connected with the first structure 31a of the mirror support 31. The conductor 34b is continuous to and electrically connected with the second structure 31b of the mirror support 31. Therefore, the conductor 34a and the conductor 34b are electrically connected with each other via the first structure 31a, the conduction plug 38A and the second structure 31b, of the mirror support 31. The insulator 34c is continuous to the insulation film 31c of the mirror support 31.

The comb-tooth electrode 35 includes a plurality of electrode teeth 35A. As shown in FIG. 19 and FIG. 20, all of the electrode teeth 35A extend from the mirror support 31 in a direction away from the direction in which the electrode teeth 34A extend, and are parallel to each other. Preferably, the direction in which the electrode teeth 35A extend is perpendicular to the direction in which the oscillating axis A3 extends. As shown in FIG. 21, each of the electrode teeth 35A has a laminate structure composed of a conductor 35a derived from the first silicon layer, a conductor 35b derived from the second silicon layer and an insulator 35c derived from the first insulation layer and is between the conductors 35a, 35b. These conductors 35a, 35b and the insulator 35c stack one after another in the direction of oscillating motion of the movable functional portion. The conductor 35a is continuous to and electrically connected with the first structure 31a of the mirror support 31. The conductor 35b is continuous to and electrically connected with the second structure 31b of the mirror support 31. Therefore, the conductor 35a and the conductor 35b are electrically connected with each other via the first structure 31a, the conduction plug 38A, and the second structure 31b, of the mirror support 31. The insulator 35c is continuous to the insulation film 31c of the mirror support 31. The comb-tooth electrode 35 or the electrode teeth 35A and the comb-tooth electrode 34 or the electrode teeth 34A as described above are electrically connected with each other via the mirror support 31.

The comb-tooth electrode 36, which works with the comb-tooth electrode 34 to generate electrostatic attraction (driving force), includes a plurality of electrode teeth 36A. As shown in FIG. 19 and FIG. 20, the electrode teeth 36A extend from the frame 32, and are parallel to each other. As shown in FIG. 21 and FIG. 23, each of the electrode teeth 36A has a laminate structure composed of a conductor 36a derived from the second silicon layer, a conductor 36b derived from the third silicon layer and an insulator 36c derived from the second insulation layer and is between the conductors 36a, 36b. The conductor 36a is continuous to and electrically connected with the island 32c of the frame 32. The conductor 36b is continuous to and electrically connected with the island 32a of the frame 32. Therefore, the conductor 36a and the conductor 36b are electrically connected with each other via the island 32c, the conduction plug 38C, and the island 32a. The insulator 36c is continuous to the portion of frame 32 derived from the second insulation layer.

The comb-tooth electrode 36 as described above constitutes a drive mechanism together with the comb-tooth electrode 34. As shown in FIG. 19 and FIG. 20, the electrode teeth 34A of the comb-tooth electrode 34 extend in parallel to the electrode teeth 36A of the comb-tooth electrode 36. As shown in FIG. 19, FIG. 20 and FIG. 23, the comb-tooth electrodes 34, 36 have their respective electrode teeth 34A, 36A offset from each other so that they will not hit each other when the mirror support 31 or the movable functional portion makes oscillating motion. During non-operation when the micromirror element X3 is not driven, as shown in FIG. 21 and FIG. 23, the conductors 34a of the electrode teeth 34 do not face the electrode teeth 36, the conductors 34b of the electrode teeth 34 do not face the conductors 36b of the electrode teeth 36, but face the conductors 36a. In other words, the comb-tooth electrode 34 or the electrode teeth 34A overlaps with the comb-tooth electrode 36 or the electrode teeth 36A in a thickness-wise direction H of the element.

The comb-tooth electrode 37, which works with the comb-tooth electrode 35 to generate electrostatic attraction (driving force), includes a plurality of electrode teeth 37A. As shown in FIG. 19 and FIG. 20, the electrode teeth 37A extend from the frame 32, and are parallel to each other. As shown in FIG. 21, each of the electrode teeth 37A has a laminate structure composed of a conductor 37a derived from the second silicon layer, a conductor 37b derived from the third silicon layer and an insulator 37c derived from the second insulation layer and is between the conductors 37a, 37b. The conductor 37a is continuous to and electrically connected with the island 32d of the frame 32. The conductor 37b is continuous to and electrically connected with the island 32b of the frame 32. Therefore, the conductor 37a and the conductor 37b are electrically connected with each other via the island 32d, the conduction plug 38D, and the island 32b. The insulator 37c is continuous to the portion of frame 32 derived from the second insulation layer.

The comb-tooth electrode 37 as described above constitutes a drive mechanism together with the comb-tooth electrode 35. As shown in FIG. 19 and FIG. 20, the electrode teeth 35A of the comb-tooth electrode 35 extend in parallel to the electrode teeth 37A of the comb-tooth electrode 37. The comb-tooth electrodes 35, 37 have their respective electrode teeth 35A, 37A offset from each other so that they will not hit each other when the mirror support 31 or the movable functional portion makes oscillating motion. During non-operation when the micromirror element X3 is not driven, as shown in FIG. 21, the conductors 35a of the electrode teeth 35 do not face the electrode teeth 37, the conductors 35b of the electrode teeth 35 do not face the conductors 37b of the electrode teeth 37, but face the conductors 37a. In other words, the comb-tooth electrode 35 or the electrode teeth 35A overlaps with the comb-tooth electrode 37 or the electrode teeth 37A in the thickness-wise direction H of the element.

FIGS. 25 through 28 show a method of manufacturing the micromirror element X3. The method is an example through which the micromirror element X3 is manufactured by bulk micromachining technology. Throughout FIGS. 25 to 28, views of a section will be given to illustrate a process of forming those components which are shown in FIG. 28C, i.e. a mirror support M, frames F1, F2, F3, torsion bars T1, T2, and a pair of comb-tooth electrodes E1, E2. The section represents a section of a material substrate (a wafer having a multi-layer structure) to which micromachining is performed and more specifically a section of a single block from which a single micromirror element is formed. The section includes sections of a plurality of component regions, and the sectional views are illustrative sequential depictions. The mirror support M represents part of the mirror support 31. The frames F1, F2, F3 represent the frame 32, shown in selected sections of the frame 32. The torsion bar T1 represents the torsion bars 33a, and is expressed in a cross section of the torsion bars 33a. The torsion bar T2 represents the torsion bars 33a, and is expressed in a longitudinal section of the torsion bars 33a. The comb-tooth electrode E1 represents part of the comb-tooth electrodes 34, 35, and is expressed in a cross section of the electrode teeth 34A, 35A. The comb-tooth electrode E2 represents part of the comb-tooth electrodes 36, 37, and is expressed in a cross section of the electrode teeth 36A, 37A.

Figure 25A:
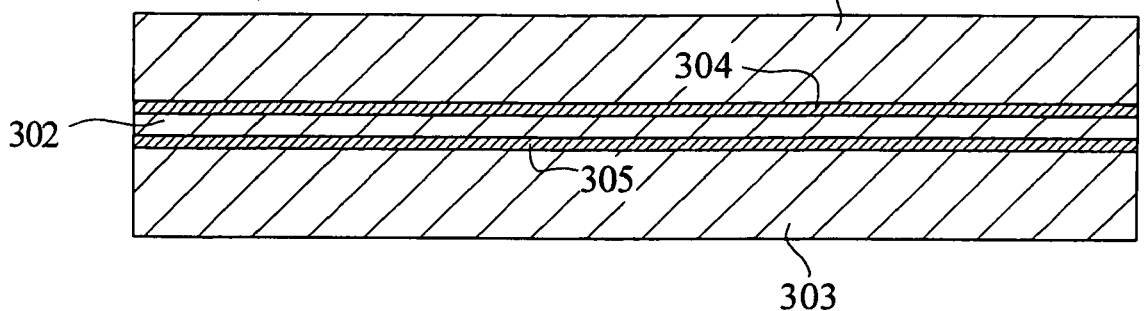
FIGS. 25A-25D show several steps of a method for manufacture of the micromirror element according to the third embodiment.

In the manufacture of the micromirror element X3, first, a material substrate 300 as shown in FIG. 25A is prepared. The material substrate 300 is an SOI wafer, which has a laminate structure composed of silicon layers 301, 302, 303, an insulating layer 304 between the silicon layers 301, 302, and an insulating layer 305 between the silicon layers 302, 303. The silicon layers 301, 302, 303 are provided by silicon material which is doped with impurity thereby rendered electrically conductive. The impurity may be selected from p-type impurities such as B or n-type impurities such as P and Sb. The insulation layers 304, 305 are provided by silicon oxide for example.

Figure 25B:
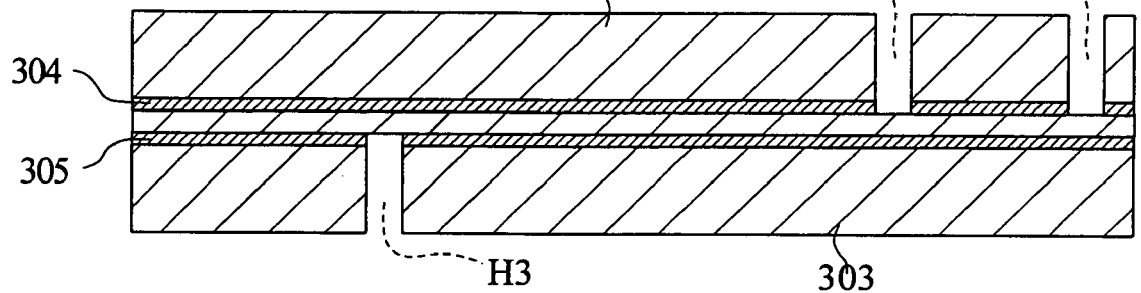

Next, as shown in FIG. 25B, holes H2 are formed to penetrate the silicon layer 301 and the insulation layer 304, as well as a hole H3 to penetrate the silicon layer 303 and the insulation layer 305. In forming the holes H2, first, the silicon layer 301 is subjected to anisotropic etching by DRIE via a predetermined mask, until the insulation layer 304 is reached, whereby predetermined holes are made in the silicon layer 301. Next, areas in the insulation layer 304 exposed to the holes are removed by e.g. wet etching. In forming the hole H3, first, the silicon layer 303 is subjected to anisotropic etching by DRIE via a predetermined mask, until the insulation layer 305 is reached, whereby a predetermined hole is made in the silicon layer 303. Next, areas in the insulation layer 305 exposed to the hole are removed by e.g. wet etching. In this way, it is possible to form the holes H2 which penetrate the silicon layer 301 and the insulation layer 304, as well as the hole H3 which penetrates the silicon layer 303 and the insulation layer 305.

Figure 25C:
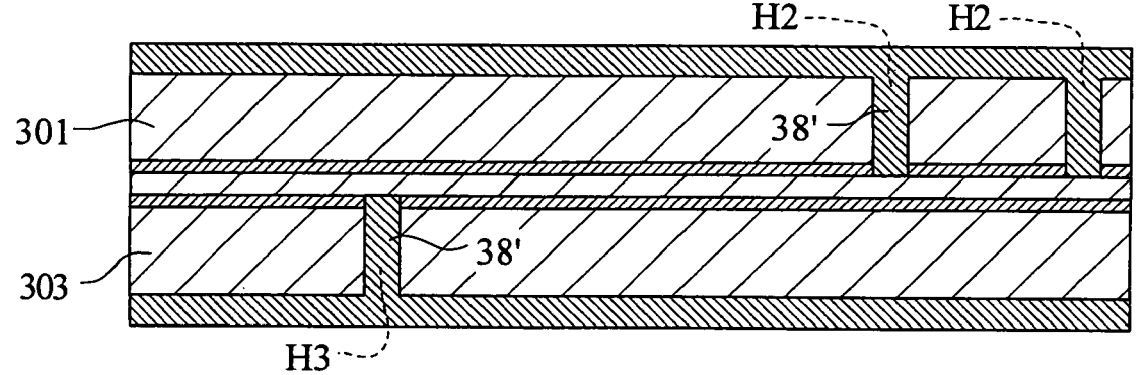

In the manufacture of the micromirror element X3, next, as shown in FIG. 25C, CVD method is used, for example, to make a deposit of electrically conductive material 38' inside the holes H2, H3. During this step, a generous amount of the conductive material 38' is supplied to the holes H2, H3 until the material builds up on the silicon layers 301, 303. Examples of the electrically conductive material 38' include polysilicon doped with a predetermined impurity, and metals such as Cu and W.

Figure 25D:
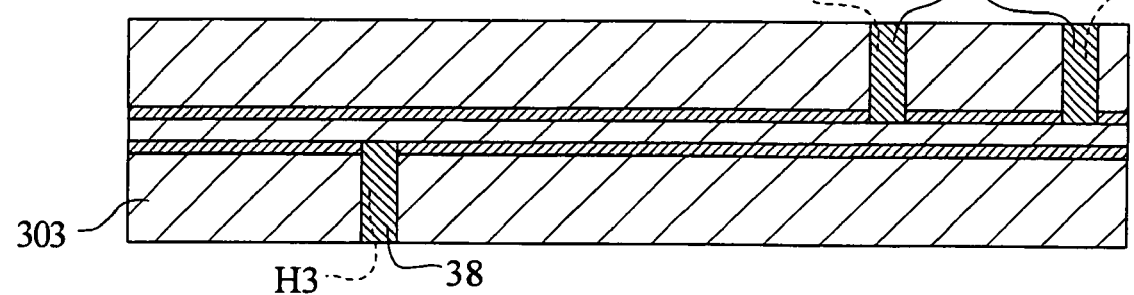

Next, as shown in FIG. 25D, surfaces of the silicon layers 301, 303 are exposed. The conductive material 38' outside of the holes H2, H3 is removed by polishing for example. This step leaves conduction plugs 38. The conduction plugs 38 on the side of the silicon layer 301 represent the conduction plugs 38A, 38B whereas the conduction plug 38 on the side of the silicon layer 303 represents the conduction plugs 38C, 38D.

Figure 26A:
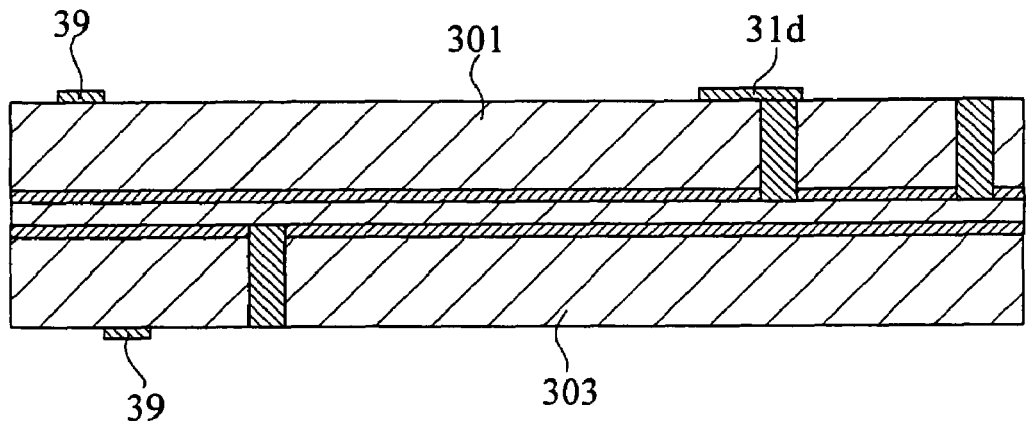
FIGS. 26A-26C show steps following those in FIG. 25.

In the manufacture of the micromirror element X3, next, as shown in FIG. 26A, a mirror surface 31d and an electrode pad 39 are formed on surfaces of the silicon layers 301, 302. In forming the mirror surface 31d and the electrode pad 39 on the silicon layer 301, first, spattering method is used to form a film of e.g. Cr (50 nm) and then of Au (200 nm) on the silicon layer 301. Next, pattern formation is made by etching these metal films sequentially with predetermined masks, to form the mirror surface 31d and the electrode pad 39. Au can be etched by using an etchant such as potassium iodide/iodine aqueous solution. Cr can be etched by using an etchant such as di-ammonium cerium nitrate aqueous solution. When forming the electrode pad 39 on the silicon layer 302, the same method is used as in the formation of the mirror surface 31d and the electrode pad 39 on the silicon layer 301. The electrode pad 39 on the silicon layer 301 represents the electrode pad 39A whereas the electrode pad 39 on the silicon layer 303 represents the electrode pads 39B, 39C.

Figure 26B:
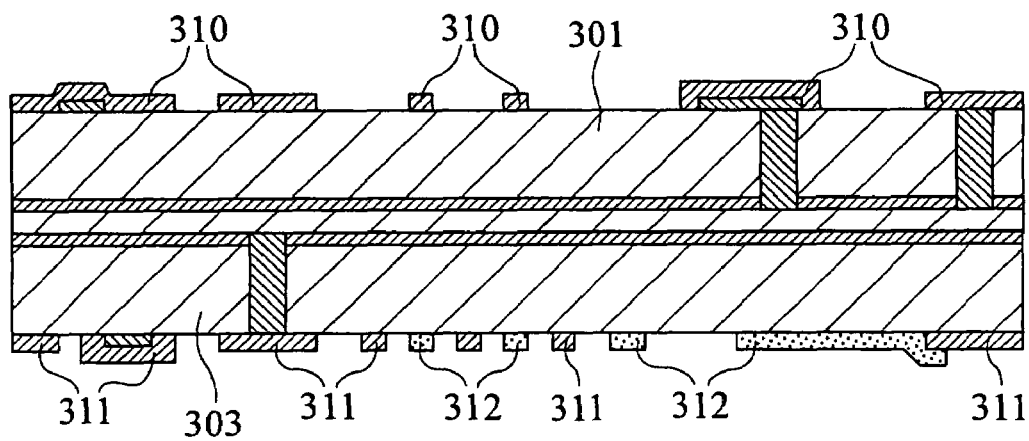

In the manufacture of the micromirror element X3, next, as shown in FIG. 26B, an oxide film pattern 310 is formed on the silicon layer 301. Also, an oxide film pattern 311 is formed on the silicon layer 303, and thereafter, a resist pattern 312 is formed thereon. The oxide film pattern 310 has a pattern corresponding to the mirror support M (mirror support 31), the frames F1, F2, F3 (frame 32), and the comb-tooth electrode E1 (comb-tooth electrodes 34, 35). The oxide film pattern 311 has a pattern corresponding to the frames F1, F2, F3 (frame 32) and the comb-tooth electrode E2 (comb-tooth electrodes 36, 37). The resist pattern 312 has a pattern corresponding to the torsion bars T1, T2 (torsion bars 33a) and the comb-tooth electrode E1 (comb-tooth electrodes 34, 35).

Figure 26C:
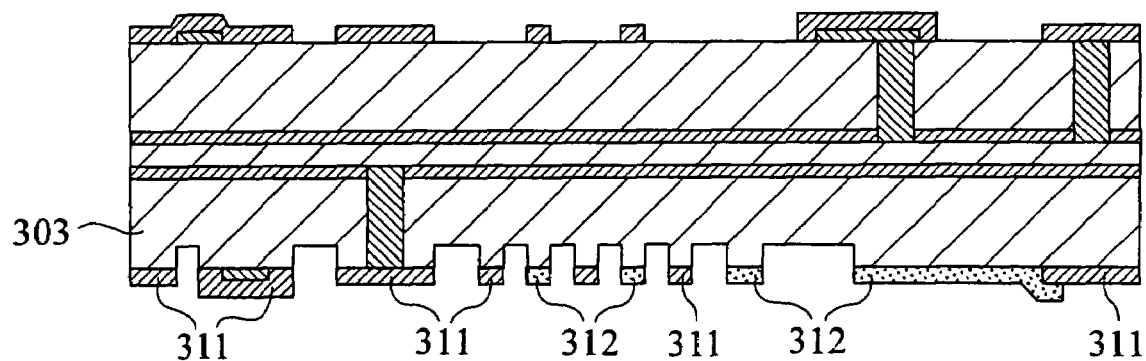

Next, as shown in FIG. 26C, anisotropic etching by DRIE is performed to the silicon layer 303 using the oxide film pattern 311 and the resist pattern 312 as masks, to a predetermined depth.

Figure 27A:
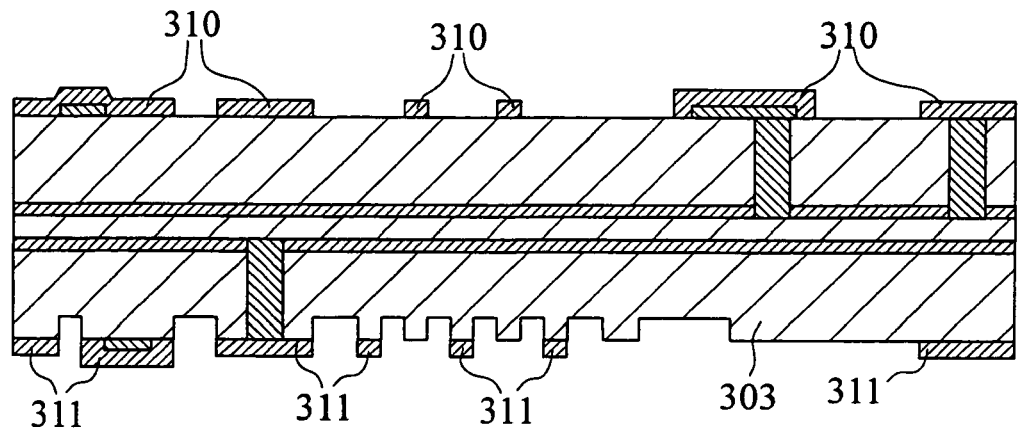
FIGS. 27A-27C show steps following those in FIG. 26.

Next, as shown in FIG. 27A, the resist pattern 312 is removed with a remover. The remover may be AZ Remover 700 (made by Clariant Japan).

Figure 27B:
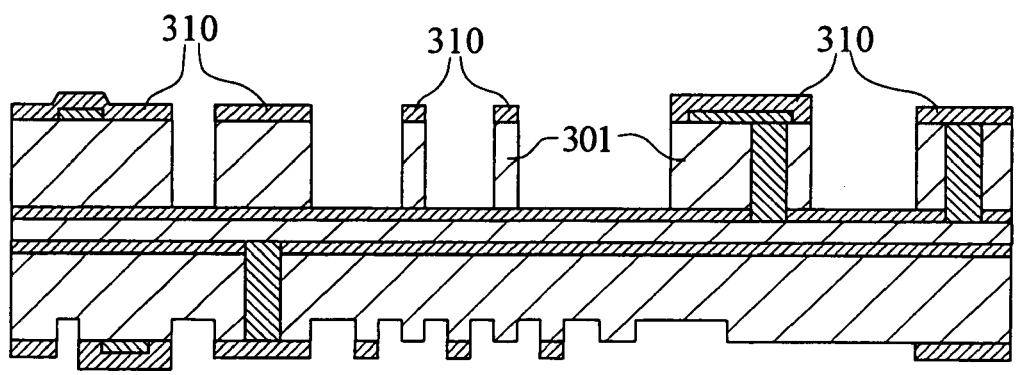
Figure 27C:
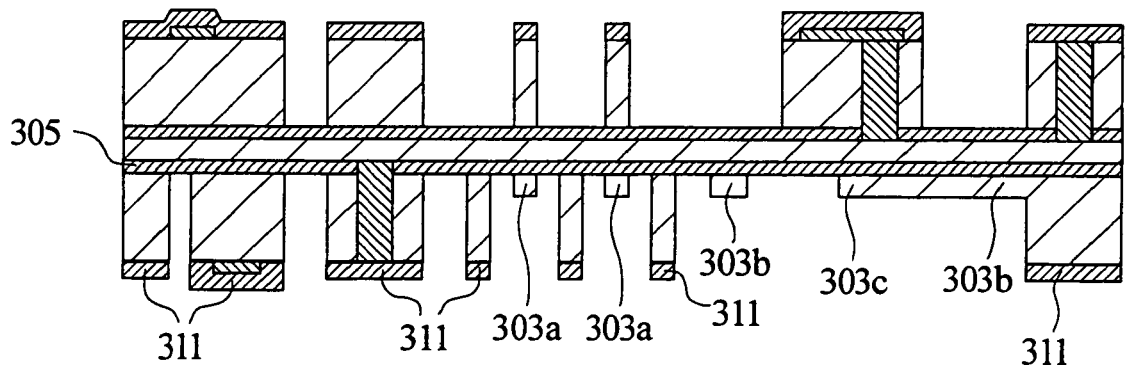

Next, as shown in FIG. 27B, anisotropic etching by DRIE is performed to the silicon layer 301 using the oxide film pattern 310 as a mask, until the insulation layer 304 is reached. This etching process yields part of the mirror support M (mirror support 31), part of the comb-tooth electrode E1 (comb-tooth electrodes 34, 35), and part of the frames F1, F2, F3 (frame 32).

Next, as shown in FIG. 27B, anisotropic etching by DRIE is performed using the oxide film pattern 311 as a mask, until the insulation layer 305 is reached. This etching process leaves a remaining mask portion 303a for the comb-tooth electrode E1, a remaining mask portion 303b for the torsion bars T1, T2, and a remaining mask portion 303c for the mirror support M. The remaining mask portions 303a, 303b, 303c combine to provide a pattern which corresponds to the resist pattern 312. The etching process in this step yields part of the frame F1, F2, F3 (frame 32), and part of the comb-tooth electrode E2 (comb-tooth electrodes 36, 37).

Figure 28A:
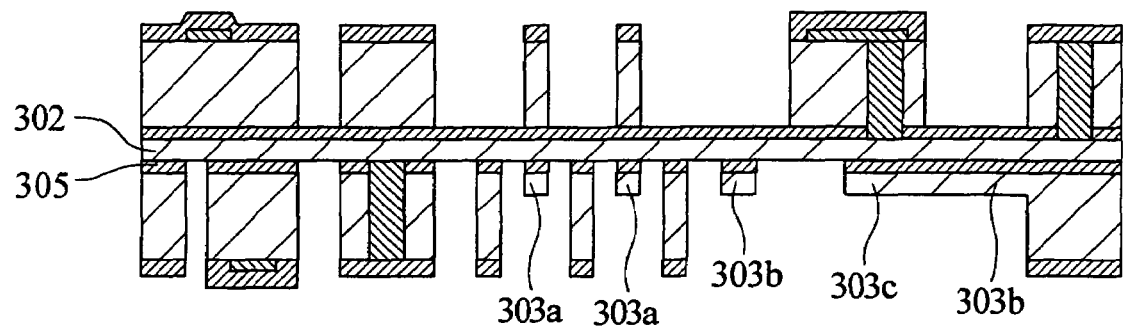
FIGS. 28A-28C show steps following those in FIG. 27.

Next, as shown in FIG. 28A, using the portion derived from the silicon layer 303 including the remaining mask portions 303a, 303b, 303b, etching is made to the insulation layer 305 until the silicon layer 302 is reached. In this process, it is necessary for the part of insulation layer 305 to be sufficiently etched off before the oxide film pattern 311 is removed to a degree that it can no longer serve as the mask. For this, a sufficient thickness must be given to the insulation layer 305 and the oxide film pattern 311. Alternatively, in the present process, the silicon layer 303 may be masked not with the oxide film pattern 311 but with a mask pattern which has etching selectivity. Such a pattern can be provided by nitride film or metal film.

Figure 28B:
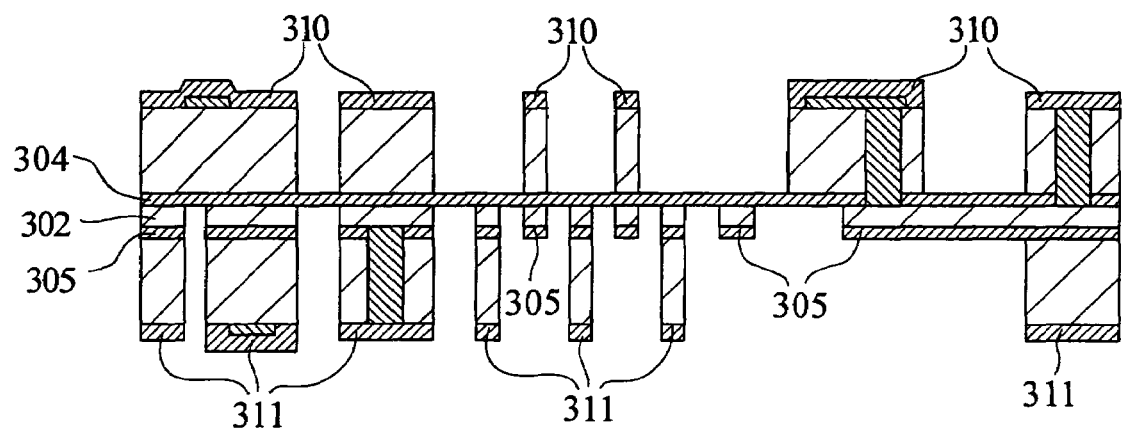

Next, as shown in FIG. 28B, anisotropic etching by DRIE is performed to the silicon layer 302 to affect regions exposed in the previous step, until the insulation layer 304 is reached. This etching process removes the remaining mask portions 303a, 303b, 303b, and leaves part of the mirror support M (mirror support 31), part of the frames F1, F2, F3 (frame 32), the torsion bars T1, T2 (torsion bars 33a), part of the comb-tooth electrode E1 (comb-tooth electrodes 34b, 35b) and part of the comb-tooth electrode E2 (comb-tooth electrodes 36a, 37a).

Figure 28C:
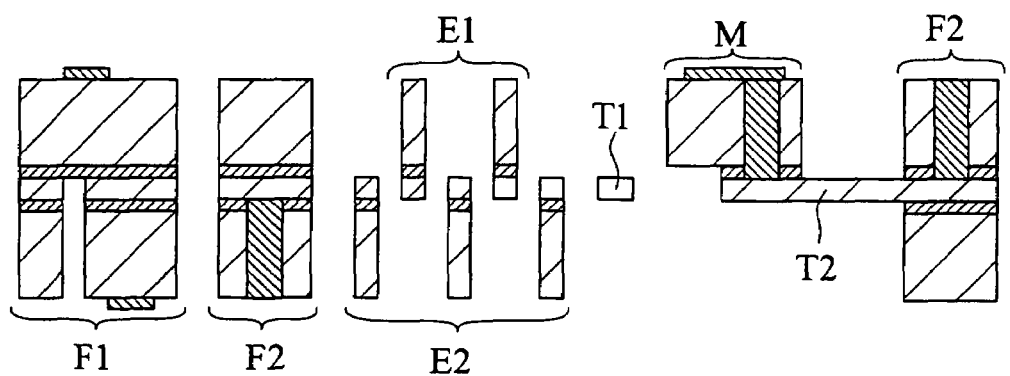

Next, as shown in FIG. 28C, exposed portions in the insulation layers 304, 305, and the oxide film patterns 310, 311 are removed by etching. The removal can be achieved by dry etching or wet etching. If dry etching is used, examples of usable etching gas include $CF_4$ and $CHF_3$. If wet etching is used, the etchant used in this process may be buffered hydrofluoric acid (BHF) which contains hydrofluoric acid and ammonium fluoride.

The above-described series of steps yield the mirror support M, the frames F1, F2, F3, the torsion bars T1, T2 and the comb-tooth electrodes E1, E2, whereby the micromirror element X3 can be manufactured.

In the micromirror element X3, by applying a predetermined voltage to the comb-tooth electrodes 34, 35, 36, 37 as required, it is possible to pivot the mirror support 31 or the movable functional portion about the oscillating axis A3. Voltage application to the comb-tooth electrodes 34, 35 can be achieved via the electrode pad 29A, the portion of frame 12 derived from the first silicon layer, the conduction plug 38B, the main portion 32C of the frame 32, the torsional joint (both of the torsion bars 33a), and the second structure 31b of the mirror support 31, as well as the conduction plug 38A and the first structure 31a of the mirror support 31. The comb-tooth electrodes 34, 35 are grounded for example. On the other hand, voltage application to the comb-tooth electrode 36 can be achieved via the electrode pad 39B, the island 32a of the frame 32, the conduction plug 38C and the island 32b of the frame 32. Voltage application to the comb-tooth electrode 37 can be achieved via the electrode pad 39C, the island 32b of the frame 32, the conduction plug 38D and the island 32d of the frame 32. Since the two voltage application routes are electrically separated from each other, voltage application to the comb-tooth electrodes 36, 37 can be made independently from each other.

Figure 29:
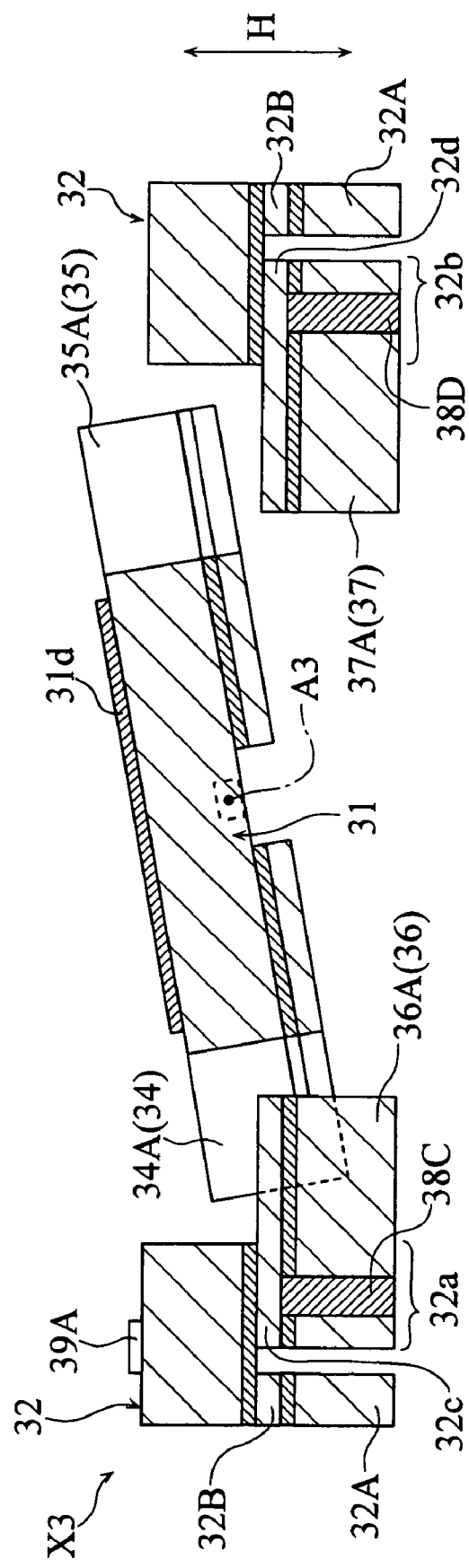
FIG. 29 is a sectional view during operation taken in lines XXI-XXI in FIG. 19.
Figure 30:
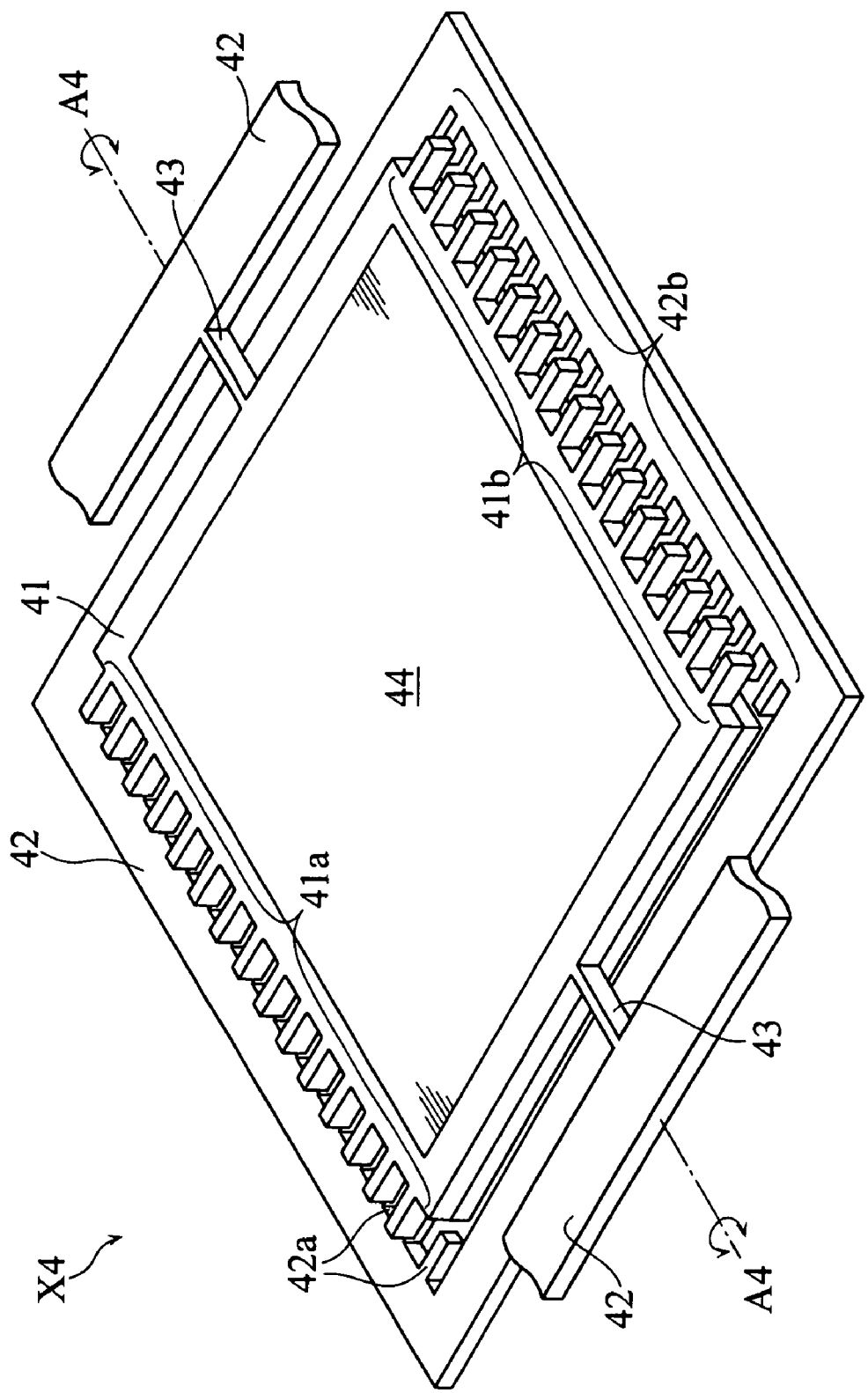
FIG. 30 is a partial perspective view of a conventional micromirror element.
Figure 31A:
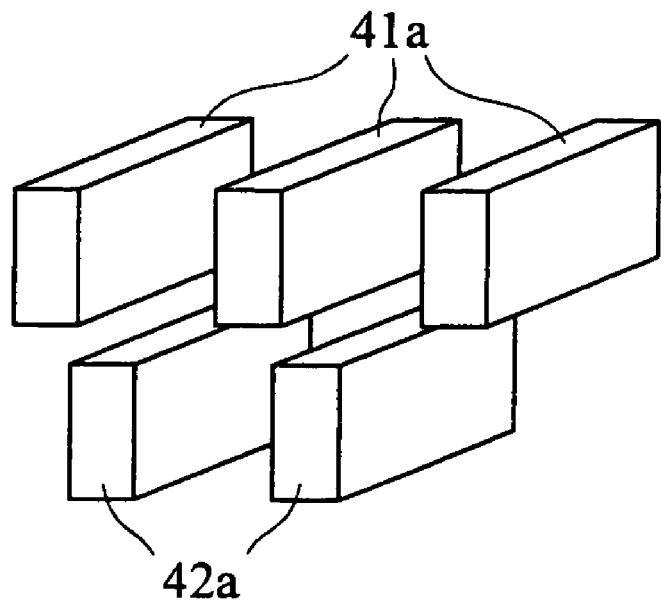
Figure 31B:
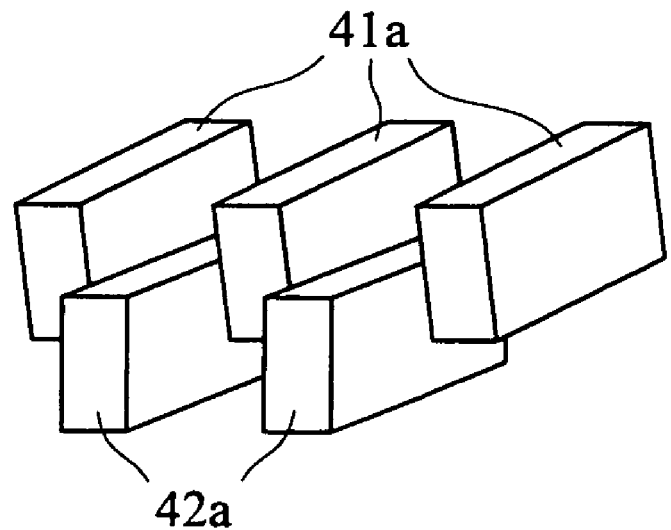

When a desired static electrical attraction is generated between the comb-tooth electrodes 34, 36 by applying a predetermined voltage to each of the comb-tooth electrodes 34, 36, the comb-tooth electrode 34 is drawn in the comb-tooth electrode 36. This causes the mirror support 31 or the movable functional portion to pivot about the oscillating axis A3, achieving a rotational displacement as shown in FIG. 29 for example, to an angle where the electrostatic attraction balances with the sum of torsional resistance forces in the torsion bars 33a. In the oscillating motion as described, the amount of rotational displacement can be adjusted by adjusting the voltage applied to the comb-tooth electrodes 34, 36. When the electrostatic attraction between the comb-tooth electrodes 34, 36 is ceased, each of the torsion bars 33a comes back to its natural state, bringing the mirror support 31 or the movable functional portion to an attitude shown in FIG. 21.

On the other hand, when a desired static electrical attraction is generated between the comb-tooth electrode 35, 37 by applying a predetermined voltage to each of the comb-tooth electrodes 35, 37, the comb-tooth electrode 35 is drawn in the comb-tooth electrode 37. This causes the mirror support 31 or the movable functional portion to pivot about the oscillating axis A3, achieving a rotational displacement, to an angle where the electrostatic attraction balances with the sum of torsional resistance forces in the torsion bars 33a. In the oscillating motion as described, the amount of rotational displacement can be adjusted by adjusting the voltage applied to the comb-tooth electrodes 35, 37. When the electrostatic attraction between the comb-tooth electrodes 35, 37 is ceased, each of the torsion bars 33a comes back to its natural state, bringing the mirror support 31 or the movable functional portion to the attitude shown in FIG. 21.

Through the oscillating drive of the mirror support 31 or the movable functional portion as described above, it is possible to appropriately switch light reflecting directions in which light is reflected by the mirror surface 31d provided on the mirror support 31.

In the micromirror element X3, even when the movable functional portion (mirror support 31, mirror surface 31d) has a rotational displacement of 0° as shown in FIG. 21, the conductor 34b of each electrode tooth 34A in the comb-tooth electrode 34 faces the conductor 36a of each electrode tooth 36A in the comb-tooth electrode 36, whereas the conductor 35b of each electrode tooth 35A in the comb-tooth electrode 35 faces the conductor 37a of each electrode tooth 37A in the comb-tooth electrode 37. In other words, even when the movable functional portion has a rotational displacement of 0°, the comb-tooth electrodes 34, 36 overlap with each other in the element thickness direction H, and the comb-tooth electrodes 35, 37 overlap with each other in the element thickness direction H. When a predetermined voltage is applied to the comb-tooth electrode 34, the conductor 34*a* and the conductor 34*b* which are electrically connected with each other within the same one of the electrode teeth 34A assume the same voltage. When a predetermined voltage is applied to the comb-tooth electrode 35, the conductor 35*a* and the conductor 35*b* which are electrically connected with each other within the same one of the electrode teeth 35A assume the same voltage. Likewise, when a predetermined voltage is applied to the comb-tooth electrode 36, the conductor 36*a* and the conductor 36*b* which are electrically connected with each other within the same one of the electrode teeth 36A assume the same voltage. Therefore, in the micromirror element X3, even when the rotational displacement of the movable functional portion is 0°, application of a predetermined voltage to the comb-tooth electrodes 34, 36 generates effective electrostatic attraction between the comb-tooth electrodes 34, 36, and application of a predetermined voltage to the comb-tooth electrodes 35, 37 generates effective electrostatic attraction between the comb-tooth electrodes 35, 37. Therefore, when moving the movable functional portion from the rotational displacement of 0° by generating electrostatic attraction between the comb-tooth electrodes 34, 36 or between the comb-tooth electrode 35, 37 in the micromirror element X3, it is easy to achieve sufficient response in the movement. On the other hand, when stopping the movable functional portion at the rotational displacement of 0°, it is possible to control electrostatic attraction between the comb-tooth electrodes 34, 36 or between the comb-tooth electrode 35, 37 highly accurately near the stopping position. Therefore, it is easy to stop the movable functional portion quickly, by reducing residual vibration of the movable functional portion near the rotational displacement of 0°.

During the operation of the micromirror element X3, when the rotational displacement of the movable functional portion is not close to 0°, the comb-tooth electrode 34, 36 overlap with each other in the element thickness direction H, thereby generating effective electrostatic attraction between the comb-tooth electrodes 34, 36. Otherwise, the comb-tooth electrodes 35, 37 overlap with each other in the element thickness direction H, thereby generating effective electrostatic attraction between the comb-tooth electrodes 35, 37.

In addition, in the micromirror element X3, the comb-tooth electrode 34 or the electrode teeth 34A are offset from the comb-tooth electrode 36 or the electrode teeth 36A in the direction of oscillating motion, and the comb-tooth electrode 35 or the electrode teeth 35A are offset from the comb-tooth electrode 37 or the electrode teeth 37A in the direction of oscillating motion. Such an arrangement is suitable for generation of effective electrostatic attraction in that the area of opposed surfaces between the comb-tooth electrodes 34 and the comb-tooth electrode 36 or between the comb-tooth electrode 15 and the comb-tooth electrode 37 changes as the movable functional portion pivots.

As described above, the micromirror element X3 has superb controllability over the entire range of oscillating motion of the movable functional portion including the starting and stopping operations. The micromirror element X3 is suitable for quick and accurate operation of the movable functional portion.

Further, according to the method of manufacturing the micromirror element X3 described above, highly accurate control is possible over the overlapping dimension between the comb-tooth electrode 34 or the electrode teeth 34A and the comb-tooth electrode 36 or the electrode teeth 36A in the element thickness direction H, as well as the overlapping dimension between the comb-tooth electrode 35 or the electrode teeth 35A and the comb-tooth electrode 37 or the electrode teeth 37A in the element thickness direction H. This is because of the use of the material substrate 300 which includes the second silicon layer 302 that has the thickness equal to the desired overlap.

The invention claimed is:

1. A method of manufacturing a micro-oscillating element by processing a material substrate including a first conduction layer, a second conduction layer and a common insulation layer between the first and the second conduction layers, the insulation layer being held in direct contact with both the first conductor layer and the second conductor layer, the micro-oscillating element comprising:
   a frame;
   a movable functional portion;
   a joint for jointing the frame and the movable functional portion and for providing the movable functional portion with an axis for oscillating motion; and
   a first comb-tooth electrode and a second comb-tooth electrode for generation of a driving force for the oscillating motion;
   the method comprising:
   a first etching step of etching the first conduction layer partway in a thickness direction thereof via a first mask pattern and a second mask pattern, the first mask pattern being formed on the first conduction layer and including a first masking portion for the first comb-tooth electrode, the second mask pattern being formed on the first conduction layer and including a second masking portion for the second comb-tooth electrode;
   a step of removing the first mask pattern;
   a second etching step of etching the first conduction layer via the second mask pattern so that the first conductor of the first comb-tooth electrode and the second comb-tooth electrode are formed in the first conduction layer as remnants held in contact with the insulation layer;
   a third etching step of etching the second conduction layer via a third mask pattern formed on the second conduction layer and including a second masking portion for the first comb-tooth electrode, the third etching step being performed so that the second conductor of the first comb-tooth electrode is formed in the second conduction layer as remnants held in contact with the insulation layer; and
   a fourth etching step of etching the insulation layer so that the insulator between the first and the second conductors of the first comb-tooth electrode is formed in the insulation layer as remnants;
   wherein in the fourth etching step, a portion of the insulation layer held in contact with the second comb-tooth electrode is completely etched away.

2. The method according to claim 1, wherein the first mask pattern includes a masking portion for the joint, the second etching step being performed so that the joint is also formed in the first conduction layer as remnants held in contact with the insulation layer.

3. The method according to claim 1, wherein a fourth mask pattern including a masking portion for the joint is embedded in the second conduction layer of the material substrate, the fourth mask pattern being spaced away from the insulation layer, wherein the third etching step is performed so that the joint is formed in the second conduction layer as remnants held in the insulation layer.

* * * * *